(12) United States Patent
Cao

(10) Patent No.: US 7,092,474 B2
(45) Date of Patent: Aug. 15, 2006

(54) LINEAR PHASE DETECTOR FOR HIGH-SPEED CLOCK AND DATA RECOVERY

(75) Inventor: Jun Cao, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 576 days.

(21) Appl. No.: 09/955,693

(22) Filed: Sep. 18, 2001

(65) Prior Publication Data
US 2003/0053576 A1 Mar. 20, 2003

(51) Int. Cl.
*H03D 3/24* (2006.01)
*H04L 7/00* (2006.01)

(52) U.S. Cl. .................. 375/375; 375/354; 375/371; 375/373; 375/226

(58) Field of Classification Search ............... 341/101, 341/100; 375/80, 81, 226, 239, 373; 359/158, 359/157; 327/159; 331/1; 369/59.2; 343/7.7
See application file for complete search history.

(56) References Cited

U.S. PATENT DOCUMENTS

| | | | |
|---|---|---|---|
| 4,535,459 A * | 8/1985 | Hogge, Jr. .................. | 375/324 |
| 5,301,196 A | 4/1994 | Ewen et al. | |
| 5,304,951 A * | 4/1994 | Cosand ....................... | 331/1 A |
| 6,121,804 A | 9/2000 | Bryan et al. | |
| 6,151,356 A * | 11/2000 | Spagnoletti et al. ......... | 375/226 |
| 6,219,380 B1 * | 4/2001 | Wang et al. ................. | 375/239 |
| 6,483,871 B1 * | 11/2002 | Dawe .......................... | 375/226 |
| 6,577,694 B1 * | 6/2003 | Meghelli ..................... | 375/373 |
| 6,593,787 B1 * | 7/2003 | Kouzuma .................... | 327/159 |
| 6,614,371 B1 * | 9/2003 | Zhang ......................... | 341/101 |
| 6,765,856 B1 * | 7/2004 | Tonami ....................... | 369/59.2 |

FOREIGN PATENT DOCUMENTS

WO  WO 01/06696  1/2001
WO  WO 01/63767  8/2001

OTHER PUBLICATIONS

U.S. Appl. No. 09/782,687, filed Feb. 2001, Jafar Savoj.*
Bowles, Richard, "Beginner's Guide to Digital Electronics", http://richardbowles.tripod.com/dig_elec/chapter7/chapter7.htm.*
Stojanovic et al, "Comparative Analysis of Latches and Flip-Flops for High-Performance Systems", IEEE ICCD '98 Proceedings, International Conference on VLSI in Computers and Processors, Oct. 5-7, 1998, pp. 264-269.*

(Continued)

*Primary Examiner*—Dac Ha
*Assistant Examiner*—Linda Wong
(74) *Attorney, Agent, or Firm*—Brake Hughes PLC

(57) ABSTRACT

Methods and apparatus for recovering a clock and data from a data signal. A method provides for receiving a clock signal having a first clock frequency and alternating between a first level and a second level, and receiving a data signal having a first data rate, the first data rate equal to the first clock frequency. The method also includes providing a first signal by storing the data signal when the clock signal alternates from the first level to the second level, and providing a second signal by passing the first signal when the clock signal is at the first level, and storing the first signal when the clock signal is at the second level. A third signal is provided by delaying the data signal an amount of time. An error signal is provided by combining the first signal and the third signal, and a reference signal is provided by combining the first signal and the second signal.

9 Claims, 16 Drawing Sheets

OTHER PUBLICATIONS

Charles R. Hogge, Jr., "A Self Correcting Clock Recovery Circuit", Journal of Lightwave Technology, vol. LT-3, No. 6, Dec. 1985 (Previously cited in IDS filed Jul. 9, 2002).

U.S. Appl. No. 09/784,419, filed Feb. 15, 2001, Jun Cao.

C.R. Hogge "A self-correcting Clock Recovery Circuit", IEEE Journal of Lightwave Technology, vol. LT-3, pp. 1312-1314, Dec. 1985.

E. Mullner, "A 20 Gb/s Parallel Phase Dectector and Demultiplexer Circuit in a Production Silicon Bipolar Technology with $f_T$=25 GHz", Proc. IEEE BCTM, pp. 43-45, Oct. 1996.

M. Rau et al., "Clock/Data Recovery PLL Using Half-Frequency Clock", IEEE Journal of Solid-State Circuits, vol. 32, No. 7, Jul. 1997.

K. Nakamura et al., "A 6 Gbps CMOS Phase Detecting DEMUX Module Using Half-Frequency Clock", IEEE, 1998 Symposium on VLSI Circuits Digest of Technical Papers.

Jafar Savoj et al., "A 10-Gb/s CMOS Clock and Data Recovery Circuit", IEEE, 2000 Symposium on VLSI Circuits Digest of Technical Papers.

* cited by examiner

LINEAR PHASE DETECTOR FOR HIGH-SPEED CLOCK AND DATA RECOVERY

BACKGROUND OF THE INVENTION

1. Field of the Invention

The present invention relates generally to phase-locked loops, and more specifically to linear phase detectors for high-speed clock and data recovery.

2. Description of the Related art

Data networking has exploded over the last several years and has changed the way people work, get information, and spend leisure time. Local area networks at the office allow for centralized file sharing and archiving. Wireless Application Protocol enabled mobile phones operating over a wide area network allow users access to news updates and stock quotes. The Internet has transformed shopping and has spawned a new recreational activity—web surfing. Many computers are used primarily as interfaces to these networks; thus the expression "the network is the computer" has been coined.

Devices such as network interface cards (NICs), bridges, routers, switches, and hubs move data between users, between users and servers, or between servers. Data moves over a variety of media such as fiber optic or twisted pair cables and the air. These media distort data, making it difficult to be read. Lightwaves traveling in a fiber optic cable reflect at the core-cladding interface and disperse. Twisted pair cables filter higher frequencies. Wireless signals bounce off surfaces in a phenomenon known as multi-path, smudging one data bit into the next.

Accordingly, these devices, NICs, bridges, routers, switches, and hubs, receive distorted data and clean it up—or retime it—for use either by the device itself or for retransmission. A useful building block for this is the phase-locked loop (PLL). PLLs accept distorted data and provide a clock signal and retimed (or recovered) data as outputs.

The demands on PLLs have become more stringent with this phenomenal growth in networking. Equipment operating at data rates of 10 gigabits per second is replacing 1 gigabit devices, which recently replaced 100 megabit units. Exacerbating the situation is the competitive nature of the networking business itself. Pricing pressures are enormous but using high-speed specialized processes raises system costs. Thus, there is a need for phase detectors that are capable of operating at these data rates but which can be made using relatively inexpensive process technologies.

SUMMARY OF THE INVENTION

Accordingly, methods and circuitry for implementing high speed phase detectors and systems for using the same are provided by embodiments of the present invention. One such embodiment provides a phase detector having a latch, a flip-flop, delay element, and exclusive OR logic. The latch, flip-flop, and delay element have inductive loads for increased gain at high frequency. This enables a relatively low power circuit in a conventional process to operate at a high data rate.

Another exemplary embodiment provides a method of recovering a clock and data from a data signal. The method includes receiving a clock signal having a first clock frequency, and alternating between a first level and a second level, and receiving a data signal having a first data rate, the first data rate being substantially equal to the first clock frequency. The method also includes providing a first signal by storing the data signal when the clock signal alternates from the first level to the second level, and providing a second signal by passing the first signal when the clock signal is at the first level, and storing the first signal when the clock signal is at the second level. A third signal is provided by delaying the data signal an amount of time. An error signal is provided by combining the first signal and the third signal, and a reference signal is provided by combining the first signal and the second signal.

A further exemplary embodiment provides a phase detector for recovering data from a received data signal. The phase detector includes a flip-flop having a data input coupled to a data input port and a clock input coupled to a clock port, a latch having a data input coupled to an output of the first flip-flop, and a clock input coupled to the clock port, and a delay element having an input coupled to the data input port. A first logic circuit having a first input coupled to the output of the flip-flop and a second input coupled to an output of the latch, and a second logic circuit having a first input coupled to the output of the first flip-flop and a second input coupled to an output of the delay element are also included.

Yet a further exemplary embodiment provides a phase detector for recovering data from a received data signal. This phase detector includes a first storage device configured to receive and store the received data signal and to generate a first signal, a second storage device configured to receive and store the first signal and to generate a second signal, and a delay block configured to delay the received data signal and to generate a third signal. A first logic circuit configured to combine the first and second signals, and a second logic circuit configured to combine the first and third signals, are also included.

DESCRIPTION OF SPECIFIC EMBODIMENTS

Figure 1:
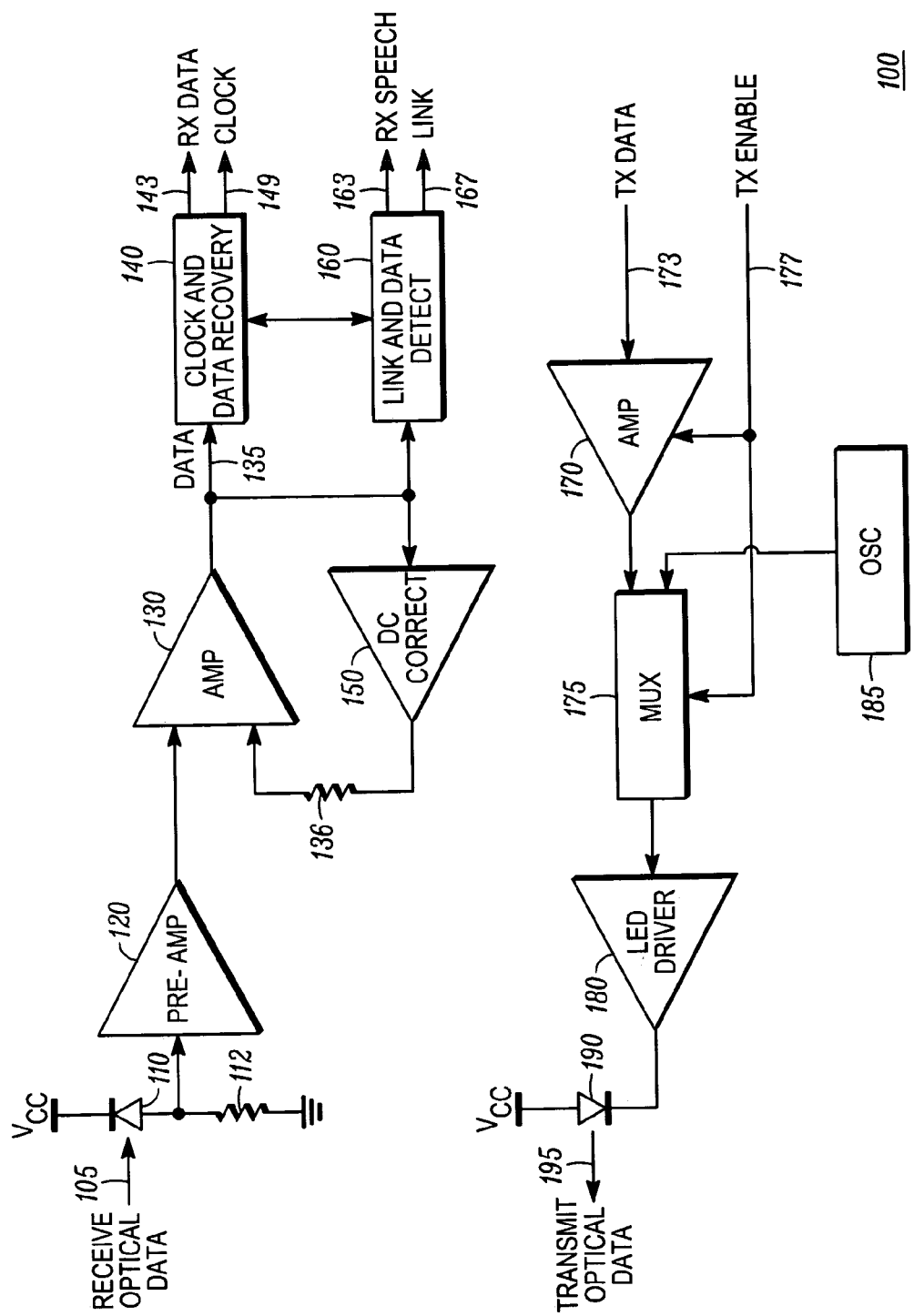
FIG. 1 is a block diagram of an exemplary optical transceiver that may incorporate an embodiment of the present invention.

FIG. 1 is an exemplary block diagram of an optical transceiver that may incorporate an embodiment of the present invention. This figure, as with all the included figures, is for illustrative purposes only and does not limit either the possible applications of the present invention or the appended claims. This optical transceiver may be on a NIC with a media access controller, some memory, and other circuits, or it may be in a hub, router, switch, or other piece of equipment.

Included is a receive path including a photo diode 110, sensing resistor 112, pre-amplifier 120, amplifier 130, DC offset correction circuit 150, clock and data recovery circuit 140, and link and data detect 160. A transmit path includes an amplifier 170, light emitting diode (LED) driver 180, multiplexer 175, oscillator 185, and LED 190. Instead of the LED driver 180 and LED 190, the optical transmitting subsystem may alternately include a laser driver and laser diode.

A receiver fiber optic cable 105 carries an optical data signal to the reversed-biased photo diode 110. Photo diode 110 senses the amount of light from fiber optic cable 105 and a proportional leakage current flows from the device's cathode to anode. This current flows through sensor resistor 112, and generates a voltage. This voltage is amplified by pre-amplifier 120 and amplifier 130. Offsets are reduced by DC correction circuit 150. The DC correction circuit 150 output is fed back to the pre-amplifier 120 through resistor 136. The output of amplifier 130 drives the clock and data recovery circuit 140, as well as the link and data detect block 160. The clock and data recovery circuits extract the clock signal embedded in the data provided on line 135 by the amplifier and with it retimes the data for output on lines 143. If the link and data detect block 160 senses either a data or link signal at the data line 135, a valid link signal is asserted on line 167. When the link and data detect block 160 senses a data signal at the data line 135, a receive squelch signal is de-asserted on line 163.

Transmit data is provided on line 173 to amplifier 170. Amplifier 170 is enabled or disabled by the transmit enable signal on line 177. When amplifier 170 is enabled, transmit data is passed to the multiplexer 175. Multiplexer 175 passes the transmit data to the LED driver 180, which in turn generates a current through LED 190. When current is driven through LED 190, light is emitted and transmitted on fiber optic cable 195. When the LED driver 180 is not driving current though LED 190, the LED is off, and the fiber optic cable 195 is dark. If the amplifier 170 is disabled, multiplexer 175 selects the idle signal from oscillator block 185. Oscillator block 185 provides an idle signal through the multiplexer 175 to the LED driver 180. This idle signal is used by a remote receiver to ensure that a valid optical connection has been made at both ends of the fiber-optic cable 105.

Again, the fiber optic media's physical limitations distort the received signal. Moreover, the delay through the amplifier 170, multiplexer 175, LED driver 180, and LED 190 may not be the same for light-to-dark and dark-to-light transitions. This mismatch causes duty cycle distortion. Further, transistor thermal noise and electrical noise in the power supply and data path generate jitter and phase noise, thus the delay through the transmitter changes as a function of time. Clock and data recovery circuits, such as block 140, retime data so it is in a more useable form for further processing, and provide a clock synchronized to the retimed data.

Figure 2:
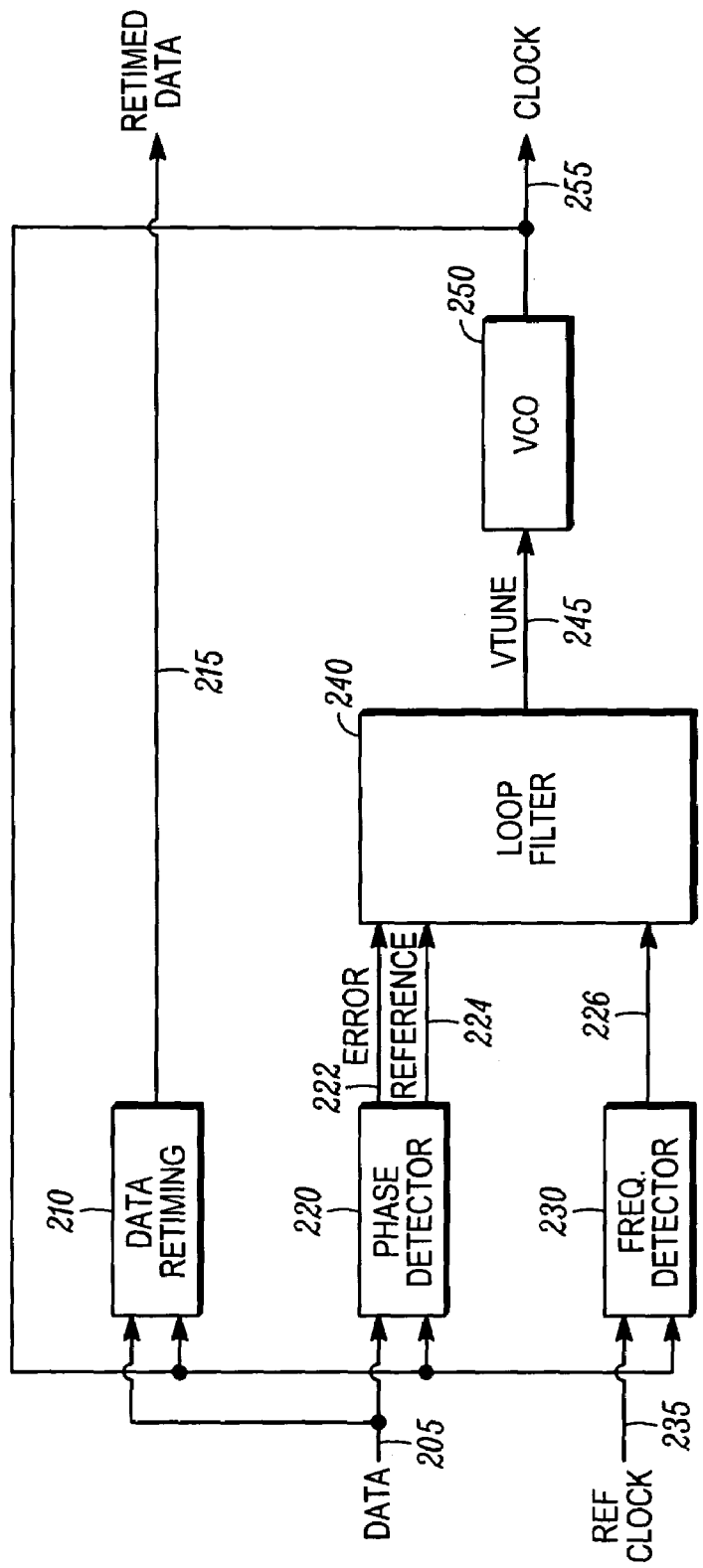
FIG. 2 is a block diagram of a clock and data recovery circuit consistent with an embodiment of the present invention.

FIG. 2 is a simplified block diagram of a clock and data recovery circuit or phase-locked loop consistent with an embodiment of the present invention. This architecture is shown for exemplary purposes, and does not limit either the possible applications of the present invention, or the appended claims.

Included in this figure are retiming block 210, phase detector 220, frequency detector 230, loop filter 240, and VCO 250. Other architectures will be readily apparent to those skilled in the art. For example, in a specific embodiment, retiming block 210 is included in phase detector 220. Further, phase detector 220 and frequency detector 230 may be the same circuit under the control of a mode switch.

At startup, the loop adjusts the VCO 250 to a correct frequency. Startup may be initiated by the power supply turning on, by the reception of a valid link by the receiver, or other appropriate event. A reference clock is provided on lines 235 to the frequency detector 230. The reference clock is often a comparatively low-frequency signal generated by a stable oscillation source, for example a crystal. The output of the VCO 250, the CLOCK signal on lines 255, is typically divided down by an integral value and compared to the reference clock by the frequency detector 230. The CLOCK signal may be single-ended or differential. If the CLOCK signal is single-ended, lines 255 are simply one line. Frequency detector 230 provides an output signal on line 226 that is filtered by loop filter 240 and provided to VCO 250 as tuning voltage VTUNE 245. If the frequency of the CLOCK signal on lines 255 is too high, the frequency detector 230 changes its output voltage on line 226, and thus VTUNE on line 245, in such a direction as to lower the CLOCK signal's frequency. Conversely, if the CLOCK signal on lines 255 is too low in frequency, the frequency detector 230 changes its output voltage on line 226, and thus VTUNE on lined 245, in such a direction as to raise the CLOCK signal's frequency.

Once the CLOCK signal on lines 255 is tuned to the correct frequency, the phase detector 220 becomes active, and the frequency detector 230 becomes inactive. It may be determined that the clock signal is at the right frequency by monitoring Vtune, by the passage of a predetermined amount of time, by another event or combination of these events. A DATA signal on line 205 is received by the data retiming block 210 and phase detector 220 on lines 205. The DATA signal may be single-ended or differential. If the DATA signal is single-ended, line 205 is simply one line. Phase detector 220 compares transitions in the DATA signal on lines 205 to the rising edges of the CLOCK signal on lines 255, and produces an ERROR signal on line 222 that is proportional to the phase relationship between them. Alternately, the phase detector 220 can be designed so that the transitions in the DATA signal are compared to the falling edges of the CLOCK signal. The ERROR signal may be single-ended or differential. If the ERROR signal is single-ended, lines 222 are simply one line. Phase detector 220 also produces a REFERENCE signal on line 224 that can be subtracted from the ERROR signal to generate a data pattern independent correction signal. The REFERENCE signal may be single-ended or differential. If the REFERENCE signal is single-ended, lines 224 are simply one line.

The ERROR and REFERENCE signals are subtracted and filtered by the loop filter 240 resulting in a voltage VTUNE 245.

As its name implies, the voltage controlled oscillator is an oscillator, the frequency of which is controlled by a voltage, in this example VTUNE. As VTUNE changes, the oscillation frequency changes. If the DATA signal on lines 205 and the CLOCK signal on lines 255 do not have the desired phase relationship, the error voltage, and thus VTUNE, changes in the direction necessary to adjust the VCO in order to correct the phase error. In a specific embodiment, if the DATA signal on lines 205 comes too soon, that is, it is advanced in time relative to the clock signal on lines 255, the phase detector increases the ERROR voltage on line 222. This results in a change in the VTUNE voltage 245 that increases the frequency of the CLOCK 255. As the frequency of the CLOCK signal on lines 255 increases, its edges come sooner in time, that is they advance. This in turn, brings the clock's rising edges into alignment with transitions in the data signal on lines 205. As the edges move into alignment, the error signal on line 222 reduces, changing VTUNE 245, thereby reducing the frequency of the CLOCK signal on lines 255. The retimed data 215 is output by data retiming block 210. This feedback insures that the DATA and CLOCK signals have the proper phase relationship for retiming the data by retiming block 210. In this condition the loop is said to be locked. Hence, these clock and data recovery circuits are referred to as phase-locked loops.

The ERROR signal on line 222 and the REFERENCE signal on line 224 provide a relatively low frequency, essentially differential, correction signal. This has several important benefits. For example, the use of a REFERENCE signal gives context to the ERROR signal, reducing the data dependent phase errors which would otherwise result. If there are no data transitions this loop has no ERROR or REFERENCE signal information to lock to, but since there is no data to recover, this special case is of no interest.

Also, conventional systems often employ what is known as a "bang—bang" phase detector. In bang—bang detectors, for each data edge, depending on its relation to the clock, a charge-up or charge-down signal is sent to a charge pump. Such detectors alternate between advancing and delaying the clock signal from the VCO but never reach a stable point. Accordingly, bang—bang detectors have a certain amount of systematic jitter. Moreover, these pulses have fast edges containing high frequency components that couple to the supply voltage and inject noise into other circuits. Reducing this noise requires either filtering or using separate supply lines decoupled from each other. By using a low frequency, effectively differential signal out, the linear fall-rate phase detector of the present invention does not have this systematic jitter and does not disturb the power supply and other circuits to the same extent.

Figure 3:
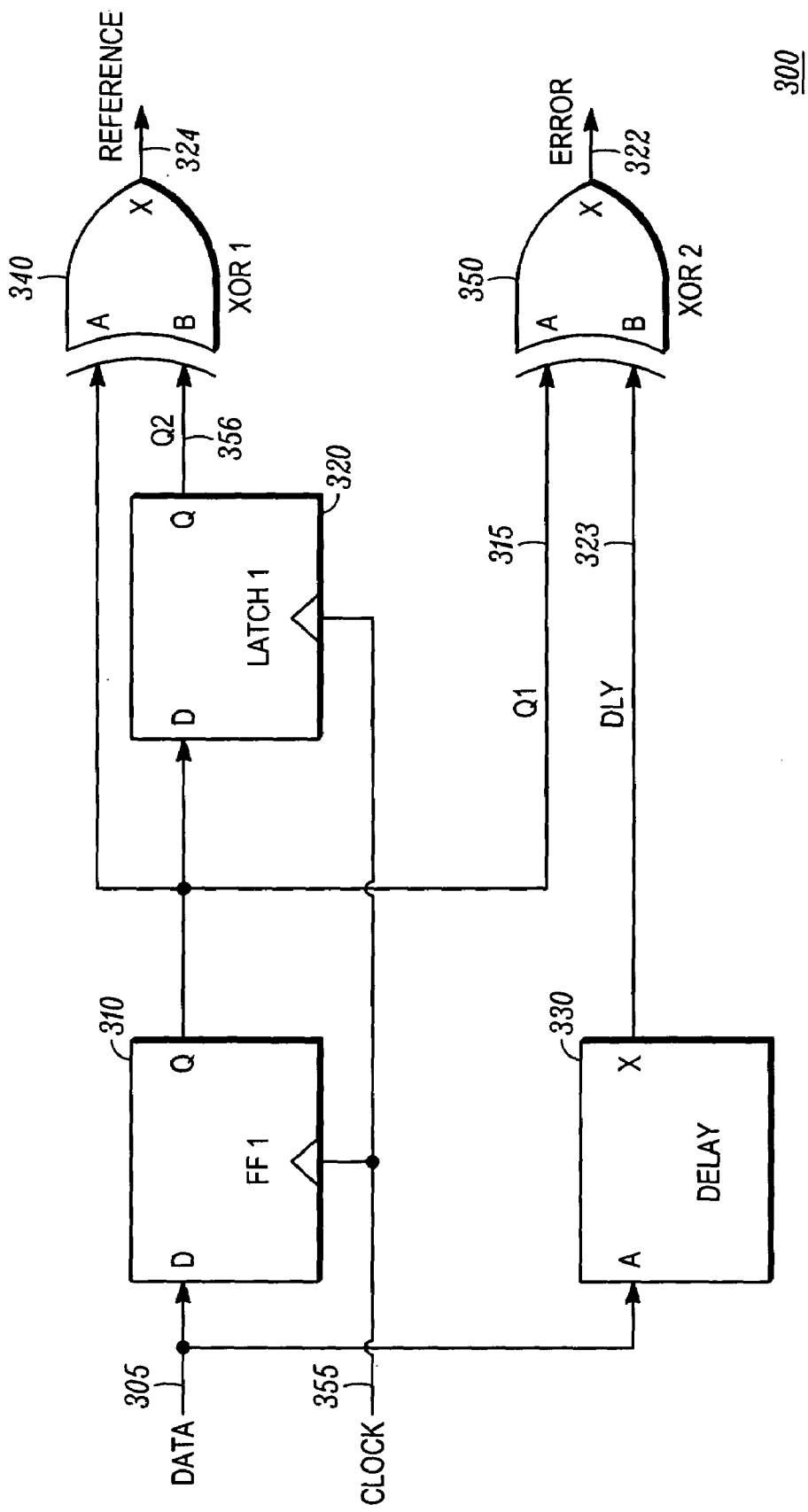
FIG. 3 illustrates a block diagram of a linear phase detector consistent with one embodiment of the present invention.

FIG. 3 is a block diagram 300 of a phase detector consistent with an embodiment of the present invention. This phase detector may be used as the phase detector 220 in FIG. 2. Alternately, it may be used in other PLL architectures. For example, it may be used in an architecture having a charge pump between the phase detector and loop filter. The phase detector shown may be used in a PLL in a fiber optic transceiver, as shown in FIG. 1. Alternately, it may be used in a PLL in other systems. Phase locked-loops are particularly important where a data processing system interfaces with a physical medium. Accordingly, this phase detector may be used in PLLs in twisted pair or coaxial transceivers, disk-drive or other mass-storage read channels, wireless receivers, routers, NICs, bridges, switches, hubs, and other electronic devices, circuits, and systems.

Included in block diagram 300 are a flip-flop 310, latch 320, delay element 330, and exclusive-OR (XOR) gates 340 and 350. The flip-flop is a negative-edge triggered device. Specifically, flip-flop 310 changes state on falling edges of the clock, while latch 320 passes data when the clock is high and latches data when the clock is low. If a negative-edge triggered flip-flop is used, the phase detector aligns the data transitions to the clock rising edges. In this way the falling edge of the clock is centered in the middle of each data bit, allowing for optimal data recovery. This "window centering" ensures that as the data eye closes due to noise, jitter, and the like, data recovery still occurs. In other embodiments, a positive-edge triggered flip-flop may be used. If a positive-edge triggered devices is used, the phase detector aligns the data transitions to the clock falling edges.

All signal paths shown may be differential or single-ended. For example, Q1 may be a differential signal including flip-flop 310 output signals Q and its complement, QBAR. In a specific embodiment, all signal paths are differential, except the error and reference outputs, which together essentially form a differential signal. Using differential signals reduces the jitter caused by noise from such sources as the power supply and bias lines.

Modifications to this block diagram will be readily apparent to one skilled in the art. For example, a combination of AND and OR gates may replace the XOR gates, or two latches may replace the flip-flop.

DATA on line 305 is received by the flip-flop 310 and delay element 330. The flip-flop 310 is clocked by the CLOCK signal on lines 355 from a VCO or clock source. On each CLOCK falling edge, the data on lines 305 is latched by the flip-flop 310 and held at the Q output as signal Q1 on line 315. The signal Q1 on line 315 passed by the latch 320 when the clock is high, and latched when the clock is low. Latch 320 provides an output signal Q2 on line 356. Delay element 330 delays the data signal and provides an output DLY on line 323. In a specific embodiment, the delay through the delay element 330 approximately equals the clock-to-Q delay of flip-flop 310. The clock-to-Q delay for a flip-flop is the delay of the output changing in response to a clock edge. XOR gate 340 has Q1 on line 315 and Q2 on line 356 as inputs. The output of XOR gate 340 is the REFERENCE signal on line 324. XOR gate 350 has Q1 on line 315 and DLY on line 323 as inputs. The output of XOR gate 350 is the ERROR signal on line 322.

To improve performance, at least three delays in this circuit are matched. Proper matching ensures that when the DATA signal transitions are aligned with the CLOCK rising edges, the resulting ERROR and REFERENCE signals have equal values. Specifically, the delay from the flip-flop 310 to the XOR gates 340 and 350 match the delay from the latch 320 to the XOR gate 340. These in turn match the delay through the delay element 330 to the XOR gate 350. In a strict sense, the delay from the flip-flop to the XOR gates 340 and 350 are two delays, but with careful layout these two delays are very well matched.

These delays are a function of two factors. First is the driving circuits themselves, that is, the circuit configuration used, and the power available to the circuit. Second is the length of the interconnect to the next cell and the next cell itself—the capacitive loading seen by the driving circuit. Thus, in a specific embodiment, the outputs of flip-flop 310, latch 320, and delay element 330 are designed to match, and the traces connecting them to XOR gates 340 and 350 are matched. Further, care has been taken to match the inputs of the XOR gates. To adjust these delays, an embodiment of the present invention has extra devices which may be configured as capacitors. These capacitors may be connected to a signal path in order to slow a signal, such that it matches another signal more accurately.

A critical timing path in this architecture is from the flip-flop 310 to the latch 320. After a clock falling edge, data is output from the flip-flop and input to latch 320. For optimal performance, it is desirable that the data be present at the latch input such that it can drive the latch output when the clock returns high. To ease this timing constraint, it is preferable that the flip-flop be very fast, i.e., have a high bandwidth. Since in a specific embodiment, latch 320 and delay element 330 have outputs that are designed to match the flip-flop's output, these output stages also need to have a high bandwidth.

But unless a specialized process is used, a high bandwidth generally translates to a high power dissipation. Embodiments of the present invention, however, provide high bandwidth circuits capable of meeting this timing requirement at high clock and data frequencies without resorting to a large power expenditure. In a specific embodiment, inductors and resistors connected in series are used as loads.

Figure 4A:
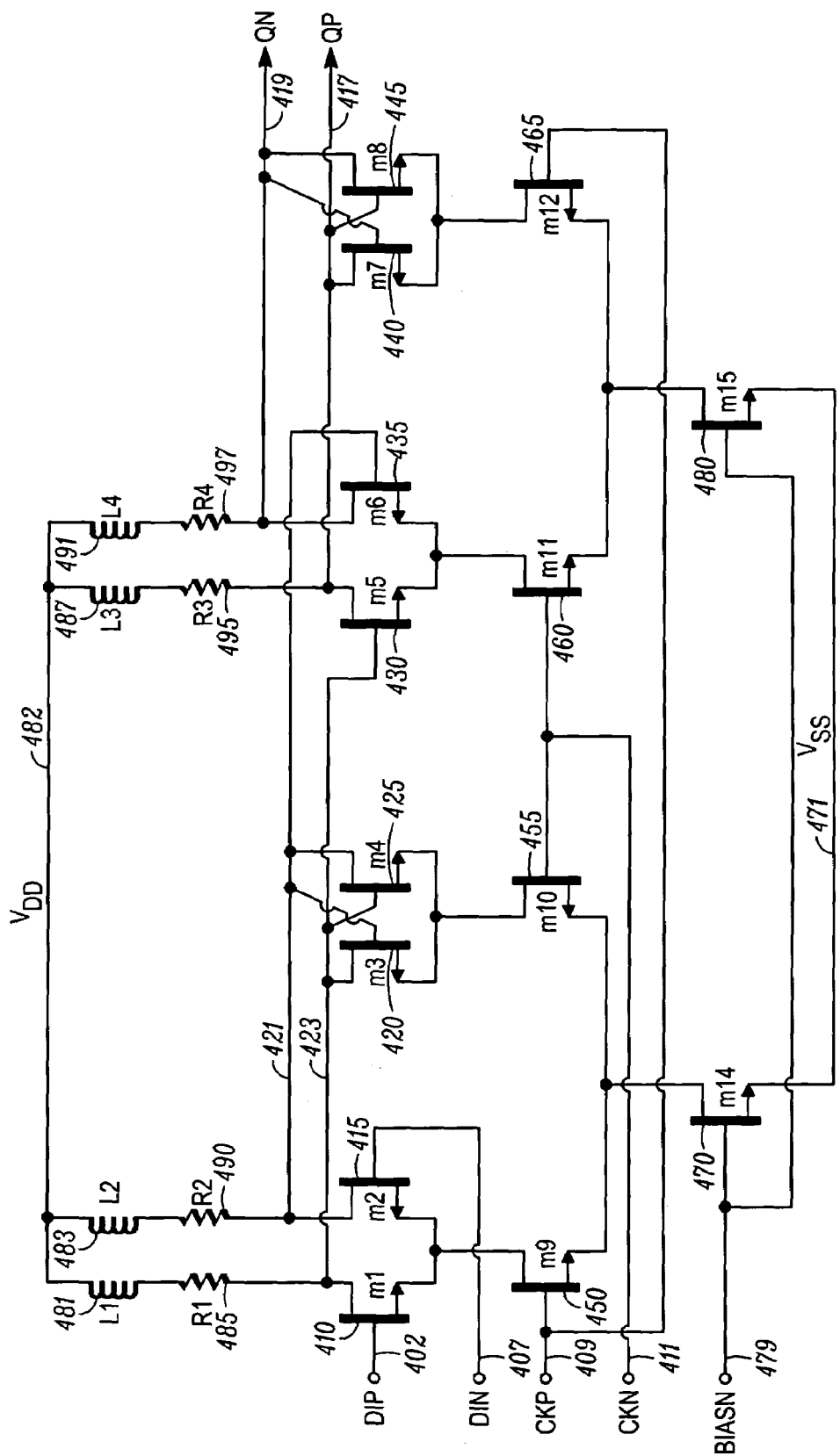
FIG. 4A is a schematic of a flip-flop that may be used in the linear phase detector of FIG. 3.

FIG. 4A is a schematic for an exemplary implementation of a negative-edge triggered flip-flop based on current-controlled CMOS ($C^3$MOS) logic with inductive broadbanding, which may be used as the flip-flop 310 in FIG. 3. The concept of $C^3$MOS logic with inductive broadbanding is described in greater detail in commonly-assigned U.S. patent application Ser. No. 09/610,905, filed Jul. 6, 2000, entitled "Current-Controlled CMOS Circuits With Inductive Broadbanding", by Michael Green, which is hereby incorporated by reference. It will be known to one skilled in the art that other flip-flops can be used, for example a bipolar flip-flop, a flip-flop made of GaAs on silicon, or other types of flip-flops could be used. Another embodiment of a flip-flop is described in commonly-assigned U.S. patent application Ser. No. 09/784,419, filed Feb. 15, 2001, entitled "Linear Full-Rate Phase Detector & Clock & Data Recovery Circuit", by Jun Cao, which is hereby incorporated by reference. Alternately, as with all the included schematics, current source loads, p-channel loads operating in their triode regions, or source follower outputs could be used. N-channel metal oxide semiconductor field effect transistors (MOSFET, or NMOS) are shown, but alternately, as with all the included schematics, p-channel (PMOS) devices could be used. The flip-flop is made up of two latches, a master and a slave, in series. In this example, a master latch includes input differential pair M1 410 and M2 415, latching devices M3 420 and M4 425, clock pair M9 450 and M10 455, current source M14 470, and series combination loads L1 481 and R1 485, and L2 483 and R2 490. A slave latch includes input differential pair M5 430 and M6 435, latching pair M7 440 and M8 445, clock pair M11 460 and M12 465, current source M15, 480, and series combination loads L3 487 and R3 495, and L4 491 and R4 497. Data inputs DIP and DIN are received on lines 402 and 407, clock inputs CKP and CKN are received on lines 409 and 411, a bias voltage BIASN is received on line 479, and outputs QP (true) and QN (complementary) are provided on lines 417 and 419.

The power supplies are shown here as VDD on line 482 and VSS on line 471. The VDD and VSS voltages for this and all the included figures are typically equal, but are not so limited. VDD may be a positive supply above ground. For example, VDD may be 5.0, 3.3, 2.5, 1.8, or other supply voltage. Alternatively, VDD may be ground. VSS may be ground. Alternately, VSS may be below ground, such as −1.8, −2.5, −3.3, −5.0, or other voltage. In other embodiments, other voltages may be used.

Bias voltage BIASN is applied to the gates of M14 470 and M15 480 relative to their sources, which are coupled to line 417. This bias voltage generates currents in the drains of M14 470 and M15 480. When the clock signal is high, the signal level of CKP on line 409 is higher than the signal level of CKN on line 411, and the master latch is in the pass mode and the slave latch is in the latched mode. Specifically, the drain current of M14 470 is passed through M9 450 to the input differential pair M1 410 and M2 415, and the drain current of M15 passes through device M12 465 to the latching pair M7 440 and M8 445. If the voltage at D is high, the voltage on line DIP 402 is higher than the voltage DIN on line 407 and the drain current of M9 flows through device M1 410 into load resistor R1 485 and load inductor L1 481, thereby lowering the voltage at the drain of M1 410. The device M2 415 is off and the voltage at its drain is high. If the voltage at QN on line 419 is high, the drain current from M12 465 passes through device M7 440 across the load resistor R3 495 and load inductor L3 487, and the signal QP on line 417 is low.

When the clock signal is low, the signal level of CKN on line 411 is higher than the signal CKP on line 409 and the master is latched and the slave passes data. The drain current of M14 470 passes through M10 455, and the drain current of M15 480 passes through device M11 460. If the signal level at DIP had previously been high such that the voltage at the drain of M1 410 is low, the drain current of M10 455 passes through device M3 420 across the load resistor R1 485 and load inductor L1 481, thus keeping the voltage at the drain of M1 410 low. Furthermore, latch pair M7 440 and M8 445 are off, and input pair M5 430 and M6 435 are on, and follow the data signal provided by latch pair M3 420 and M4 425. In this example, M6 435 is on, and conducts the drain current of M11 460 to the load resistor R4 497 and load inductor L4 491, pulling down QN on line 419, and allowing QP on 417 to return high. Therefore, after each clock falling edge, the signal voltage CKN on line 411 exceeds in the signal voltage CKP on line 409, and the data at the input port DIP 402 and DIN 407 is latched by the master latch and output by the slave latch on lines QP 417 and QN 419.

If this flip-flop is used for the flip-flop in FIG. 3, the following should be noted. If the signals are differential, DIP, CKP and QP correspond to the D, clock, and Q ports of the flip-flop in FIG. 3. If single-ended signals are used, DIN and CKN are coupled to bias voltages that preferably have a DC voltage equal to the average signal voltage at DIP and CKP. This circuit can be changed into a positive-edge triggered flip-flop by reversing the CKP and CKN lines.

The clock-to-Q delay for this circuit can be described qualitatively by way of an example. Let the initial conditions be such that the clock input CKP is high, the output voltage QP on line 417 is low, and the D input DIP is high. The drain current of M15 480 flows through M12 465 through M7 440 into the load resistor R3 495 and load inductor L3 487. Also, the drain current of M14 470 flows through M9 450, and through device M1 410 through the load resistor R1 485 and load inductor 481. Accordingly, the voltage on line 423 is lower than the voltage on line 421. After the following edge of the clock signal, CKN on line 411 is higher than CKP on line 409. Thus, the drain current of M15 480 switches from M12 465 to M11 460. M11 460 directs current through M6 435, where it flows through load resistor R4 497 and load inductor L4 491. QP on line 417 goes high and QN on line 419 goes low. Thus, the clock-to-Q delay is the delay time it takes for M11 460 to turn on and conduct the current of M15 480, plus the time required for M6 to turn on and conduct current thereby changing voltage QN on line 419 and QP on line 417.

The inductors in the loads increase the high frequency gain of this flip-flop and help the phase detector of FIG. 3 meet its timing requirements. The inductors provide gain at high frequency, which helps compensate for the gain roll off that occurs due to limited device bandwidth, as well as trace and parasitic capacitances. This additional gain ensures that signal levels at high frequency remain large enough to switch the devices in following latches and input pairs. This enables consistent delay times to be realized, which allows the matching that is needed for proper performance.

Figure 4B:
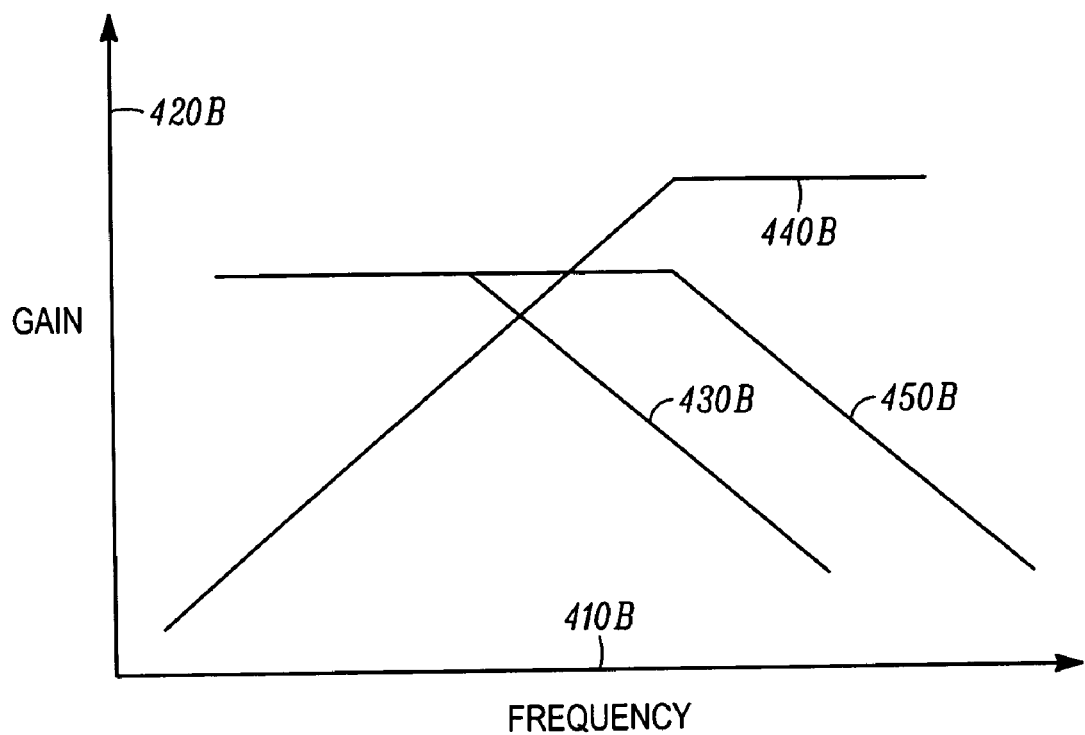
FIG. 4B is a Bode plot of one of its stages.

FIG. 4B is a Bode plot showing the gain of a latch in the flip-flop of FIG. 4A as a function of frequency. Gain is plotted along an X-axis 410B corresponding to frequency and a Y-axis 420B corresponding to gain in dB. The gain contribution provided by the resistive part of the series load is shown as curve 430B. Thus, at low-frequencies the gain is flat and begins to fall off at higher frequencies due to capacitive effects at the drains of the differential and latching pairs. The contribution to the overall gain provided by the load inductors is shown as curve 440B. Since the inductor is a short at DC, there is no gain at low frequencies. As the frequency increases, the gain increases until the limitations of the transistors, drain capacitance, and interconnect parasites take effect. The combined gain contributions of the resistor and inductor are shown as curve 450B. As can be seen, at low frequencies the gain is provided by the resistor, and curve 450B matches curve 430B. At higher frequencies gain stays high longer than a resistor alone, and then decreases. Thus, adding an inductor to the loads in the flip-flop increase the circuit's bandwidth. Accordingly, at high frequencies the addition of inductors enables proper switching in the flip-flop and downstream logic gates. In a specific embodiment, each inductor has a value of approximately 2.2 nH and a Q in the range of 4–20. The relative gain provided by the inductive and resistive portions of the loads may vary, those shown in this figure are but one example.

Figure 5:
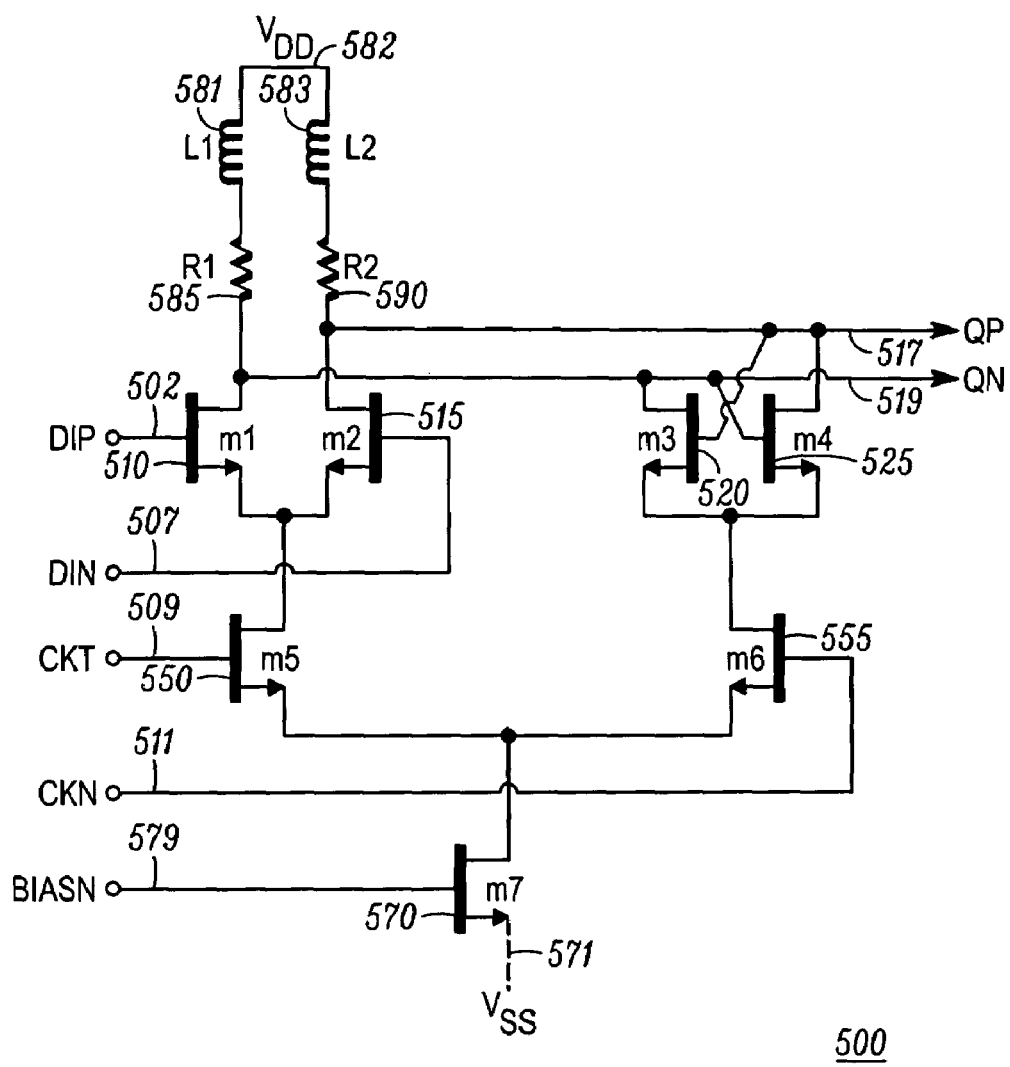
FIG. 5 is a schematic of a latch that may be used in the linear phase detector of FIG. 3.

FIG. 5 is a schematic 500 of a latch with inductive broadbanding that may be used as latch 320 in FIG. 3. Alternately, other types of latches may be used, for example cross coupled logic gates may be used. Included are input differential pair M1 510 and M2 515 latching pair M3 520 and M4 525, clock pair MS 550 and M6 555, current source M7 570, and series loads of inductor L1 581 and resistor R1 585, and inductor L2 538 and resistor R2 590. Data inputs DIP and DIN are received on lines 502 and 507, clock inputs CKP and CKN are received on lines 509 and 511, bias violate BIASN is received on line 579, and outputs QP (true) and QN (complementary) are provided on lines 517 and 519. Power supply VDD 582 is connected to the input differential pair M1 510 and M2 515 through inductors L1 and L2 581, 583 and resistors R1 and R2 585, 590. The other power supply VSS 571 is connected to current source M7 570.

The bias voltage BIASN is applied on line 579 to the gate of M7 570 relative to its source that is coupled to line 517. When the clock input signal is high, the signal voltage CKP on line 509 is higher than the signal voltage CKN on 511 and the drain current of M7 570 flows through M5 550 to the input differential pair M1 510 and M2 515. When the D input is high, the signal voltage DIP on line 502 is higher than the signal voltage DIN on line 507 and the drain current from M5 550 flows through device M1 510 through load inductor L1 581 and resistor R1 585 pulling the signal voltage QN on line 519 low and allowing the signal voltage QP on line 517 to go high. When the clock signal goes low, the voltage CKN on line 511 is high and signal voltage CKP on line 509 is low. Thus, device M6 directs the drain current from M7 570 to the latching pair M3 520 and M4 525, which latch the data at the QP 517 and QN 519 outputs.

The clock-to-Q delay through this gate is the delay of M5 530 turning on and conducting, plus M1 510 turning on and conducting, thus pulling down the signal QN on line 519. As can be seen this is very similar to the clock-to-Q delay of the flip-flop in FIG. 4A.

If this latch is used as the latch in FIG. 3, the following should be noted. If the signals are differential, DIP, CKP and QP correspond to the D, clock, and Q ports of the latch in FIG. 3. If single-ended signals are used, DIN and CKN are coupled to bias voltages that preferably have a DC voltage equal to the average signal voltage at DIP and CKP.

Figure 6:
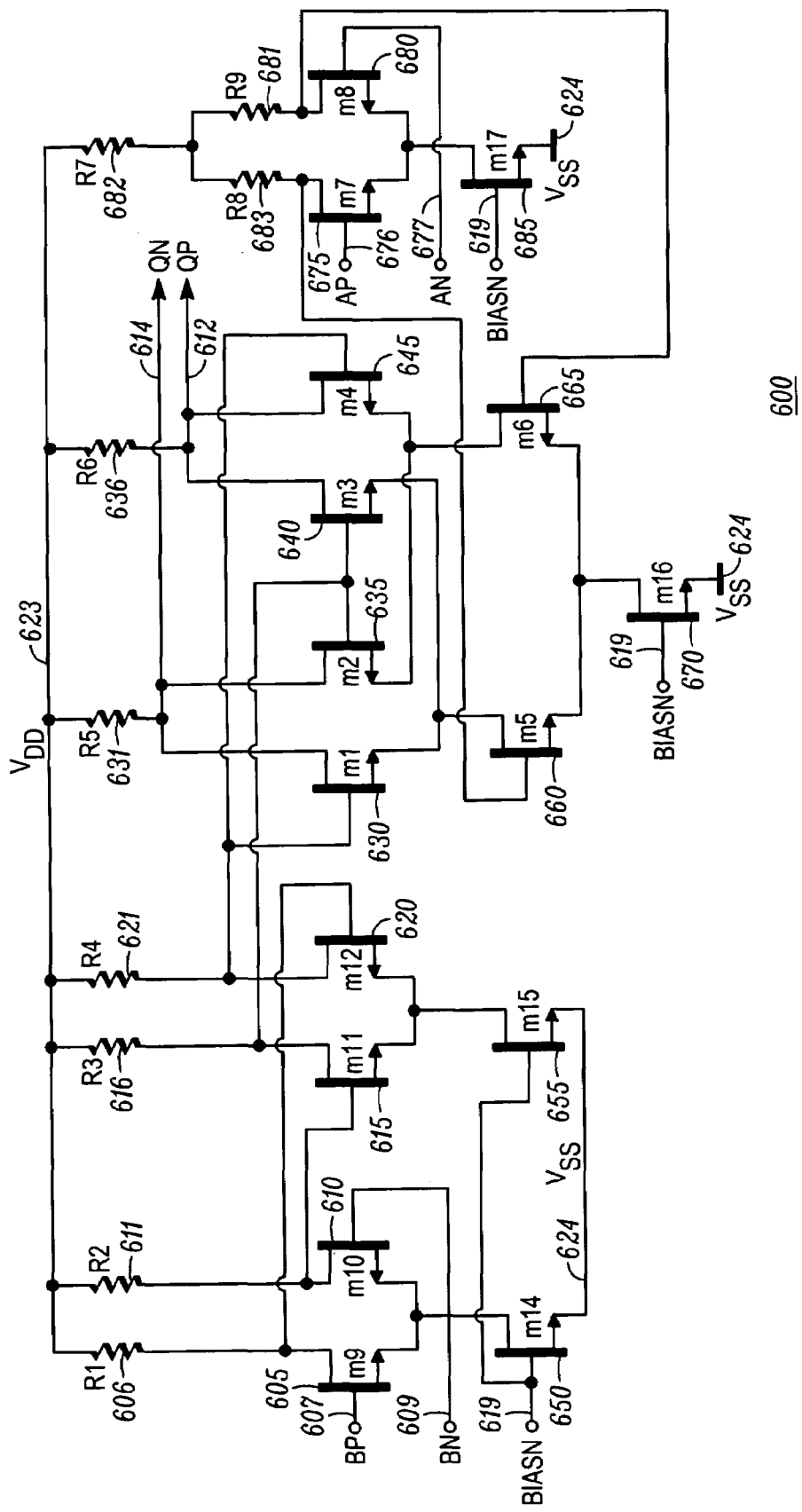
FIG. 6 is a schematic of an XOR gate which may be used in the high-speed phase detector of FIG. 3.

FIG. 6 and is an exemplary high speed XOR gate implemented using $C^3MOS$ logic that may be used with various embodiments of the present invention. For example, this XOR gate may be used as XOR gates 340 and 350 in FIG. 3. Alternately, other XOR gates may be used, such as a bipolar XOR gate. Included are B input buffers M9 605 and M10 610, and M11 615 and M12 620, and A input buffer M7 675 and M8 680. An XOR core made up of devices M1 630, M2 635, M3 640, M4 645, M5 660, and M6 665, is also shown. Inputs AP and AN are received on lines 676 and 677, inputs BP and BN are received on lines 607 and 609, bias voltage BIASN is received on line 619, and QP (true) and QN (complementary) outputs are provided on lines 612 and 614. Current sources M14 650, M15 655, M16 670, and M17 685, are biased with BIASN such that a current is produced in their drains. The BIASN voltage applied to all these devices may be equal to each other. Alternately, different BIASN voltages may be used for the buffers and the core. Further, the buffers may have differing BIASN voltages. Also, this BIASN voltage may the same or different voltage as the BIASN voltage in FIGS. 4 and 5.

Signals at the A input steer the drain currents of M16 670 through either MS 600 or M6 665. The signal at the B input steers the current to the load resistors thereby generating voltage outputs at QP and QN on lines 612 and 614. The connections are such that QP is high when the signal at either, but not both, the A input and the B input are high. To match the delay from input to output, two buffers are used in the B path, and one buffer is used in the A path. This is because the A input steers the lower devices M5 and M6, which then drive upper devices M1 through M4. But the B input drives devices M1 to M4 directly. Thus, to compensate for the delay through the M5 660 and M6 665, an extra buffer is inserted in the B path. Resistor R7 682 lowers the common mode voltage of the output of the A input buffer, including M7 675 and M8 680, which improves the transient response of the lower differential pair M5 660 and M6 665.

An alternate embodiment for an XOR gate can be found in commonly assigned U.S. patent application Ser. No. 09/782,687, filed Feb. 12, 2001, entitled "Linear Half-Rate Phase Detector and Clock and Data Recovery Circuit," by Jafar Savoj, which is hereby incorporated by reference. Also, other architectures which may be used to implement some of the circuits herein can be found in commonly assigned U.S. patent application Ser. No. 09/484,856, filed Jan. 18, 2000, entitled "$C^3MOS$ Logic Family," by Armond Hairapetian, which is hereby incorporated by reference.

Figure 7:
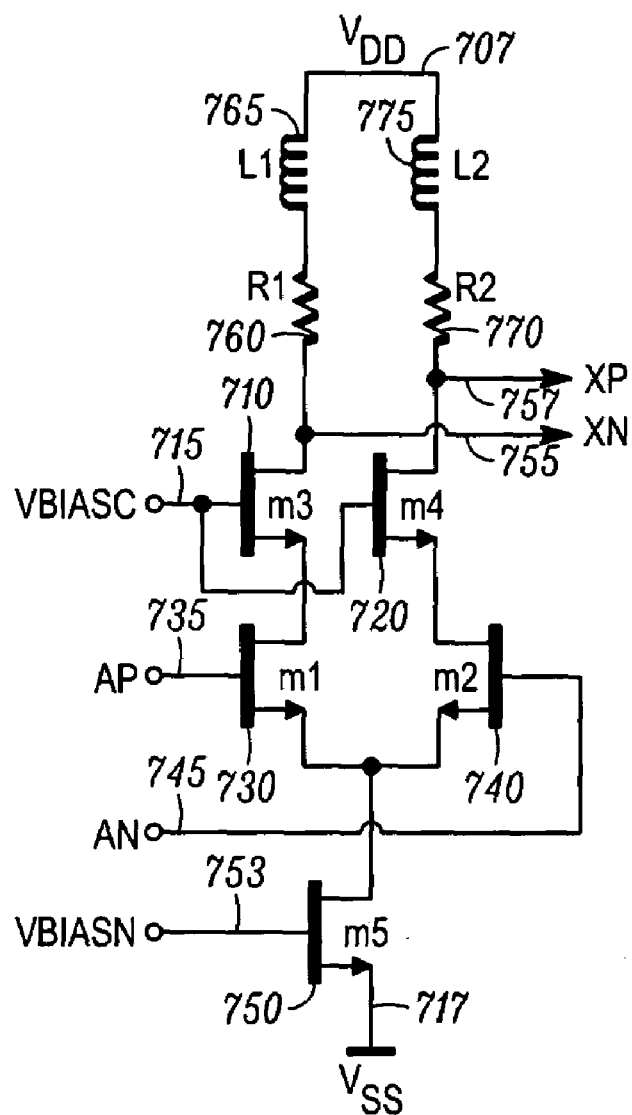
FIG. 7 is a schematic of a delay block which may be used in the high-speed phase detector of FIG. 3.

FIG. 7 is a schematic of an exemplary circuit implementation for a delay circuit with inductive broadbanding that may be used as delay element 330 in FIG. 3. It will be known to one skilled in the art that this delay block could be designed several different ways. For example, an RC network could be used. Included are input pair devices M1 730 and M2 740, cascode devices M3 710 and M4 720, series loads of inductor L1 765 and R1 760, and L2 775 and R2 770, and current source device M5 750. Inputs AP and AN are received on lines 735 and 745, bias voltages BIASN and VBIASC are received on lines 753 and 715, and outputs XP (true) and XN (complementary) are provided on lines 757 and 755.

VBIASC may be tied to VDD or other appropriate bias point. An input signal is applied at the A port, AP on line 735 and AN on line 745, to the first input pair M1 730 and M2 740. Bias voltage BIASN is applied to the gate of M5 relative to its source terminal that is coupled to line 717. BIASN may be the same bias line as was used in FIG. 4A or it may be a different bias voltage. This voltage generates a current in the drain of M5 750. If the voltage at the A input port is high, the signal voltage AP on line 735 is higher than the signal level of AN on line 745 and the drain current of M5 750 flows through the device M1 730, through cascode device M3 710, to the load resistor R1 760 and load inductor L1 765, pulling the voltage XN on line 755 low. Conversely, if the signal at the A port is low, the voltage signal at AP is lower than the signal level at AN and the drain current of M5 730 flows through device M2 740, through cascode device M4 720, to the load resistor R2 770 and load inductor L2 775, pulling output XP on line 757 low. In this way, a signal applied to input port A on lines 735 and 745 results in a delayed signal appearing at lines at XP 757 and XN 755.

By matching the drain current of M5 750 with the drain current of M7 570 of the latch of FIG. 5 and the drain current of M15 480 of the flip-flop of FIG. 4A, the output delay of these three circuits may be matched.

In a specific embodiment, die area is conserved by not including inductors L1 765 and L2 775 in the loads. Rather, the load resistors R1 760 and R2 770 connect directly between VDD line 707 and the drains of M3 710 and M4 720. In this embodiment, the width of device M5 750, and thus its drain current is decreased, and the value of resistors R1 760 and R2 770 are increased relative to the flip-flop and latch such that the delay through this block matches the clock-to-Q delays of the storage elements. Thus, the voltage swing of the delay block is substantially equal to the latch and flip-flop. In this way, sufficient matching may be retained while saving the area that two inductors would otherwise consume.

If this delay element is used as the delay element in FIG. 3, the following should be noted. If the signals are differential, AP and XP correspond to the A and X ports of the latch in FIG. 3. If single-ended signals are used, AN is coupled to a bias voltage that preferably has a DC voltage equal to the average signal voltage at AP.

Figure 8:
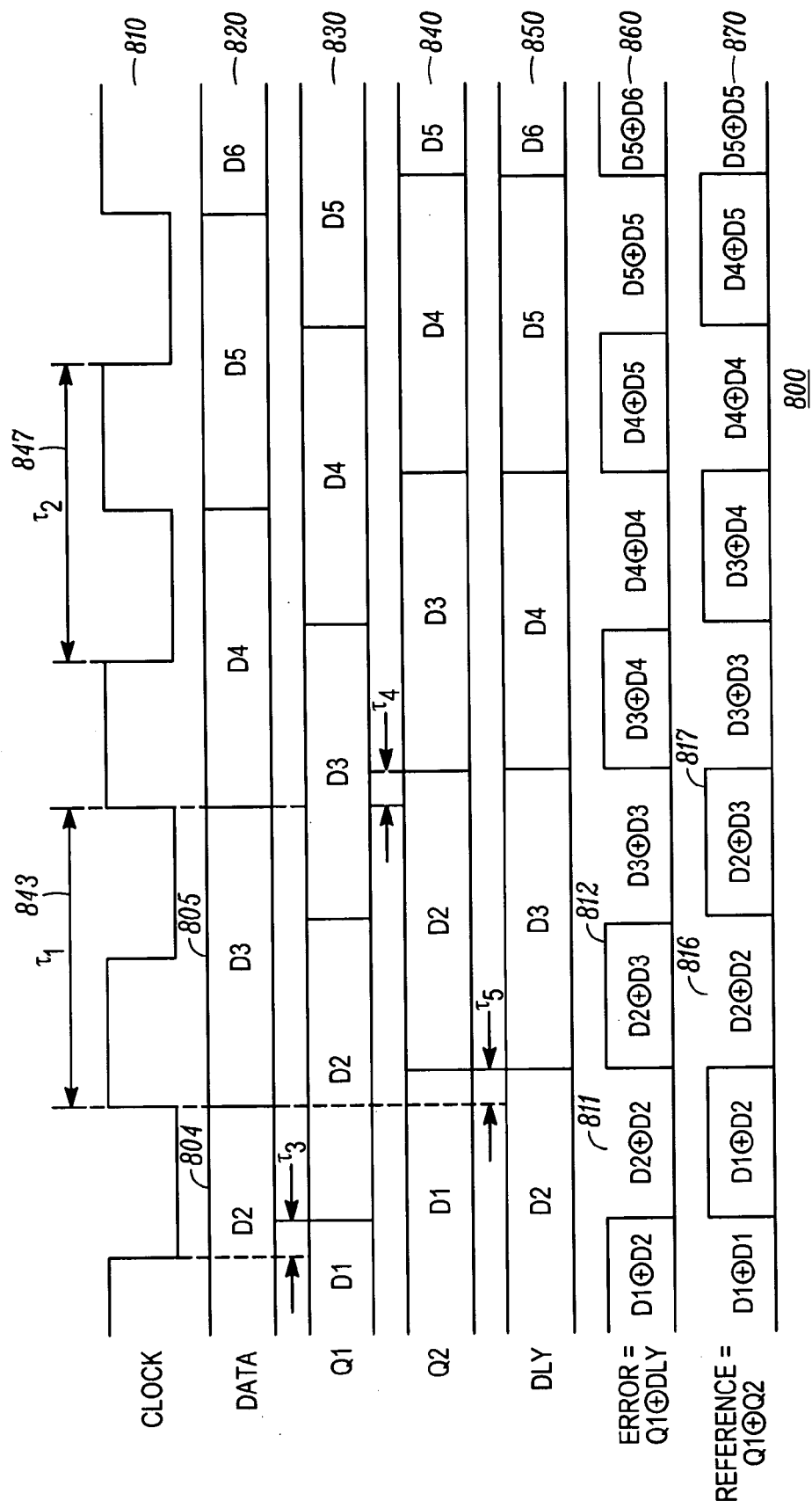
FIG. 8 is a generalized timing diagram a phase detector consistent with one embodiment of the present invention.

FIG. 8 is a generalized timing diagram of signals in a phase detector consistent with one embodiment of the present convention, such as the block diagram of FIG. 3. But this and the following timing diagrams are not limited to the circuit of FIG. 3 and may be generated by other circuitry consistent with the present invention. Included are inputs CLOCK 810 and DATA 820, and resulting signals Q1 830, Q2 840, DLY 850, ERROR 860, and REFERENCE 870. Data bits, such as 804 and 805, have a duration equal to one clock cycle. Each data bit may be high or low, and the DATA signal 820 may transition or remain constant from one bit to the next.

Q1 830 is DATA 820 retimed. There is typically delay between a transition of Q1 830 as compared to the falling edges of the CLOCK 810, particularly if Q1 is generated by a flip-flop clocked by falling edges of the CLOCK signal 810 and having DATA 820 as its D input. Q2 840 is Q1 830 delayed by one half clock cycle. There may be a delay between a transition of Q2 840 as compared to the rising edge of the CLOCK 810, particularly if Q2 is generated by a latch that passes data when the CLOCK signal 810 is high and has Q1 830 as its D input. Signal DLY 850 is a delayed version of DATA 820.

DLY 850 may be generated by delaying DATA 820 by an amount approximately equal to the delay of signal Q1 830 as compared to the CLOCK 810. ERROR 860 is generated by XORing Q1 830 and DLY 850. REFERENCE 870 is generated by XORing Q1 830 and Q2 840.

When transitions in the DATA signal 820 are approximately centered between clock falling edges, for some time period approximately following each falling edge of CLOCK 810, ERROR 860 is low. This is because after each falling edge of CLOCK 810, Q1 830 follows DATA 820. Accordingly, for some time period following each clock falling edge, Q1 830 and DATA 820 are equal in value. For example, in the time 811 prior to the ERROR pulse 812, both Q1 and DLY are in the state D2. Sometime later, DATA 820 either transitions to a new level or retains the same value. If DATA 820 changes to a new state, then DLY 850 and Q1 830 become unequal, and the ERROR signal 860 is high. But if data signal 820 retains its value, ERROR 820 remains low. Specifically, if data bits D2 and D3 are equal, then ERROR bit 812 is low. But if data bits D2 and D3 are not equal, then ERROR bit 812 is high.

ERROR signal 860 is dependent on the phase relationship between DATA 820 and CLOCK 810 in the following manner. If data bit 804—D2—is low and data bit 805—D3—is high, then ERROR pulse 812 is high. If the DATA signal 820 advances, that is shifted to the left, then pulse 812 in the ERROR signal 870 widens (becomes longer in duration). If the DATA signal 820 is delayed, that is shifted to the right, then pulse 812 of ERROR signal 860 narrows (becomes shorter in duration).

But note as above, if D2 and D3 are equal, then ERROR pulse 812 is low. Therefore, the average ERROR voltage is dependent not only on the phase error between CLOCK 810 and DATA 820, but on the data pattern of DATA 820. For this reason, the ERROR signal 860 is most meaningful in the context of REFERENCE signal 870.

This is because the REFERENCE signal's average value is also data dependent. For some time period following each rising edge of CLOCK signal 810, the REFERENCE signal 870 is low, since at each rising edge of the CLOCK 810, Q1 830 is equal to Q2 840. For example, in the time prior 816 before reference pulse 817, both Q1 830 and Q2 840 are in the state D2. In the next half CLOCK cycle Q1 has the value of the next data bit D3 while Q2 remains unchanged. Therefore, if the data bits D2 and D3 are equal then REFERENCE pulse 817 is low. But if data bits D2 and D3 are not equal, then REFERENCE bit 817 is high.

For random data, each data bit may be high or low with equal probability and may change state or remain constant at each transition, also with equal probability. Thus, each ERROR pulse, such as 812, has an equal probability of being high or low. Also each REFERENCE signal pulse, such as 817, is high an equal number of times as ERROR 860. If the DATA transitions are aligned with the rising edge of the CLOCK 810, the ERROR signal 870 and the REFERENCE signal 880 are each low half the time and either high or low with equal probability the other half. This means that the ERROR signal 870 and REFERENCE signal 880 each have an average AC value equal to one-fourth their AC peak value.

If the data is not random, for instance if DATA 820 consists of a long string of either high or low data bits, then error pulses, such as 812, and REFERENCE pulses, such as 817 are low. The error and reference signals average values are at a minimum. But if the data changes every bit, then each error signal pulse and each reference bit is high. Therefore, the error and reference signals are equal to one-half their peak values. Thus, the error and reference signals have the same data pattern dependency, while the error signal also tracks the phase error. This means the data dependency of ERROR signal 870 can be corrected by subtracting the REFERENCE signal 880. The difference signal between error and reference is not dependent on the data pattern, but is dependent on the phase error. This resulting signal has approximately a zero value when the edges of the data signal are aligned with the clock rising edges. As the data is delayed, the differential value becomes negative. As the data advances, the difference becomes positive.

Each data bit has a duration $t_1$ 843. The reciprocal of the data bit duration $t_1$ 843 is referred to as the data rate. Each clock period has a duration $t_2$ 847, where $t_2$ is equal to $t_1$. The clock frequency is the reciprocal of the duration $t_2$ 847. Thus, the clock frequency is equal to the data rate.

Various modifications will be apparent to one skilled in the art. For example, a clock signal with a reversed polarity may be used, such that the transitions of the data align with the clock falling edges.

Figure 9:
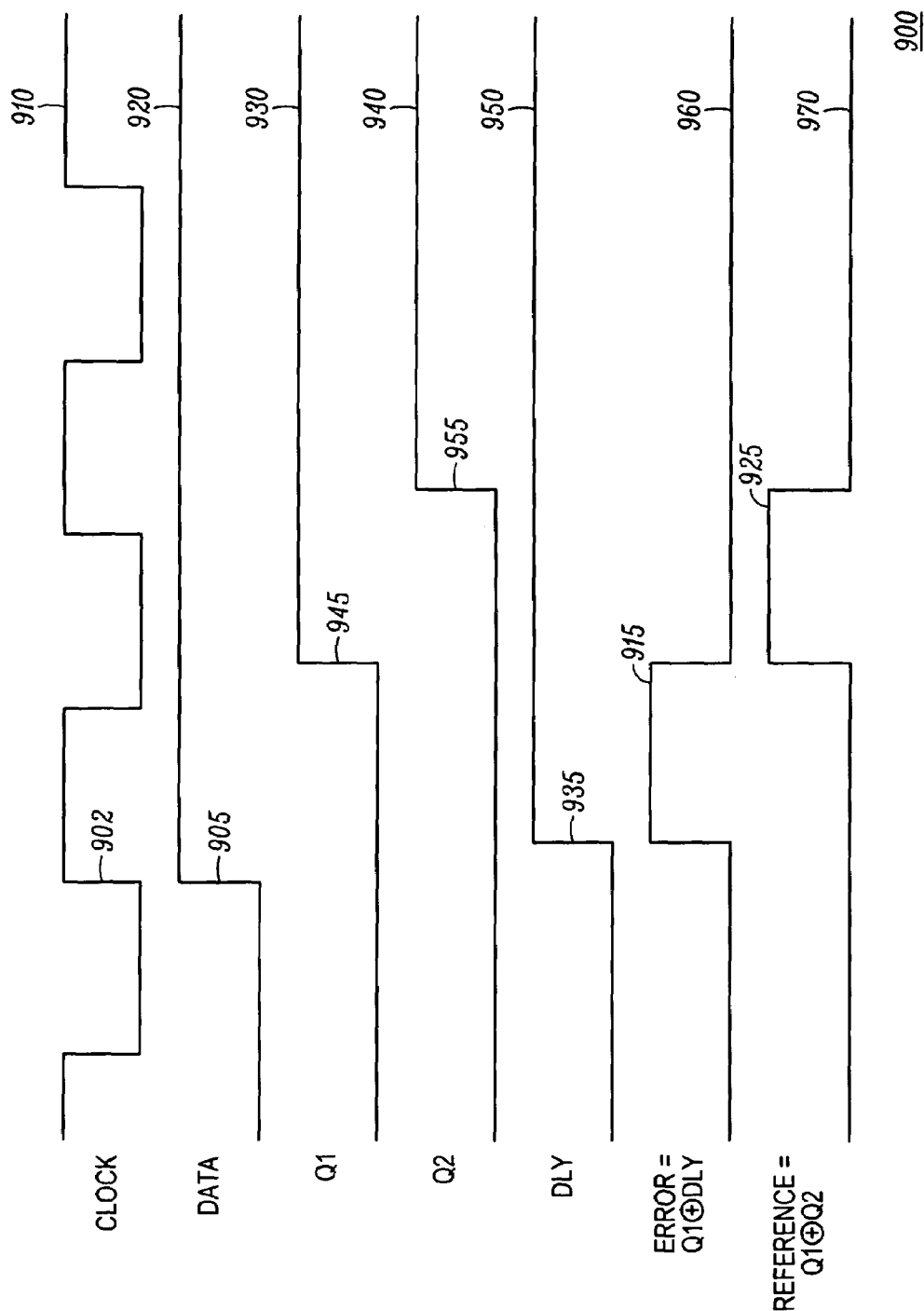
FIG. 9 is a specific timing diagram for a data transition with no phase error.

FIG. 9 is a timing diagram of an embodiment of the present invention showing a specific data transition 905. Included are inputs CLOCK 910 and DATA 920, and resulting signals Q1 930, Q2 940, DLY 950, ERROR 960, and REFERENCE 970. In this example, DATA 920 transition 905 occurs at a time corresponding to the rising edge 902 of CLOCK 910. Q1 is DATA signal 920 retimed and following the next falling edge of CLOCK 910. Q2 940 is Q1 930 delayed by one half a clock cycle. DLY 950 is DATA 920 delayed in time. Again, DATA 920 may be delayed by a time approximately equal to the phase delay between a transition in Q1 930 and a falling edge of CLOCK 910 to generate DLY 950. ERROR 960 is the XOR of Q1 930 and Q2 940. In some applications, DATA 920 may not need to be delayed, and the DATA signal 920 may be XORed with Q1 930 to generate ERROR 960. REFERENCE 970 is the XOR between Q1 930 and Q2 940.

As can be seen in this diagram, an ERROR pulse 915 and a REFERENCE pulse 925 result from the data transition 950. Specifically, ERROR pulse 915 begins, or goes high, at the rising edge 935 of DLY 950, at the rising edge 945 of Q1 930. Similarly, REFERENCE pulse 925 begins at the edge 945 of Q1 930 and ends when Q2 940 goes high at edge 955. Since edges 902 and 905 are aligned, pulses 915 and 925 are approximately equal.

Figure 10:
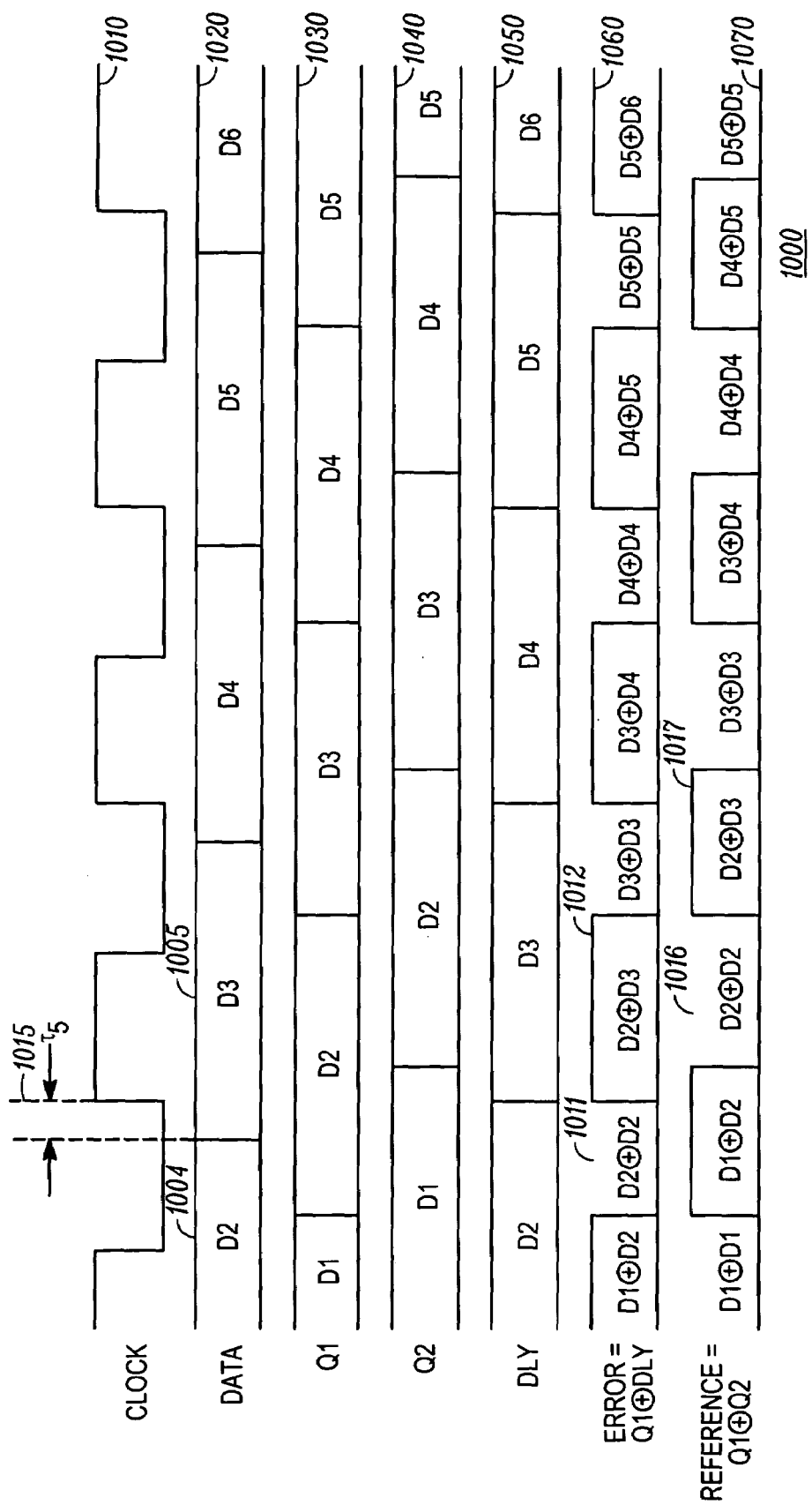
FIG. 10 is a generalized timing diagram with a leading phase error introduced.

FIG. 10 is a generalized timing diagram of signals in a phase detector consistent with one embodiment of the present convention, such as the block diagram of FIG. 3. But this timing diagram is not limited to the circuit of FIG. 3 and may be generated by other circuitry consistent with the present invention. Included are inputs CLOCK 1010 and DATA 1020, and resulting signals Q1 1030, Q2 1040, DLY 1050, ERROR 1060, and REFERENCE 1070. Data bits, such as 1004 and 1005, have a duration equal to one clock cycle. Each data bit may be high or low, and the DATA signal 1020 may transition or remain constant from one bit to the next.

Q1 1030 is DATA 1020 retimed. There is typically delay between a transition of Q1 1030 as compared to the falling edges of the CLOCK 1010, particularly if Q1 is generated by a flip-flop clocked by falling edges of the CLOCK signal 1010 and having DATA 1020 as its D input. Q2 1040 is Q1 1030 delayed by one half clock cycle. There may be a delay between a transition of Q2 1040 as compared to the rising edge of the CLOCK 1010, particularly if Q2 is generated by a latch that passes data when the CLOCK signal 1010 is high and has Q1 1030 as its D input. Signal DLY 1050 is a delayed version of DATA 1020.

DLY 1050 may be generated by delaying DATA 1020 by an amount approximately equal to the delay of signal Q1 1030 as compared to the CLOCK 1010. ERROR 1060 is generated by XORing Q1 1030 and DLY 1050. REFERENCE 1070 is generated by XORing Q1 1030 and Q2 1040.

In this timing diagram, DATA 1020 is advanced or shifted to the left by a time $t_5$ 1015 relative to the rising edges of CLOCK 1010. A consequence of this is that DLY 1050 is advanced in time. Since ERROR pulses begin at transitions in DLY, the ERROR pulses begin earlier. Specifically, ERROR pulse 1012 starts earlier than ERROR pulse 812 in FIG. 8. Again, Q1 1030 is DATA 1020 retimed to CLOCK 1010, so Q1 1030 is aligned to Q1 830 in FIG. 8. Since the ERROR pulse 1012 ends when Q1 1030 transitions, pulse 1012 ends at the same relative time as pulse 812. Accordingly, ERROR pulse 1012 starts earlier and ends at the same relative time as ERROR pulse 812, and is thus wider.

ERROR signal 1060 is dependent on the phase relationship between DATA 1020 and CLOCK 1010 in the following manner. If data bit 1004—D2—is low and data bit 1005—D3—is high, then ERROR pulse 1012 is high. If the DATA signal 1020 advances, that is shifted to the left, then pulse 1012 in the ERROR signal 1070 widens (becomes longer in duration).

Figure 11:
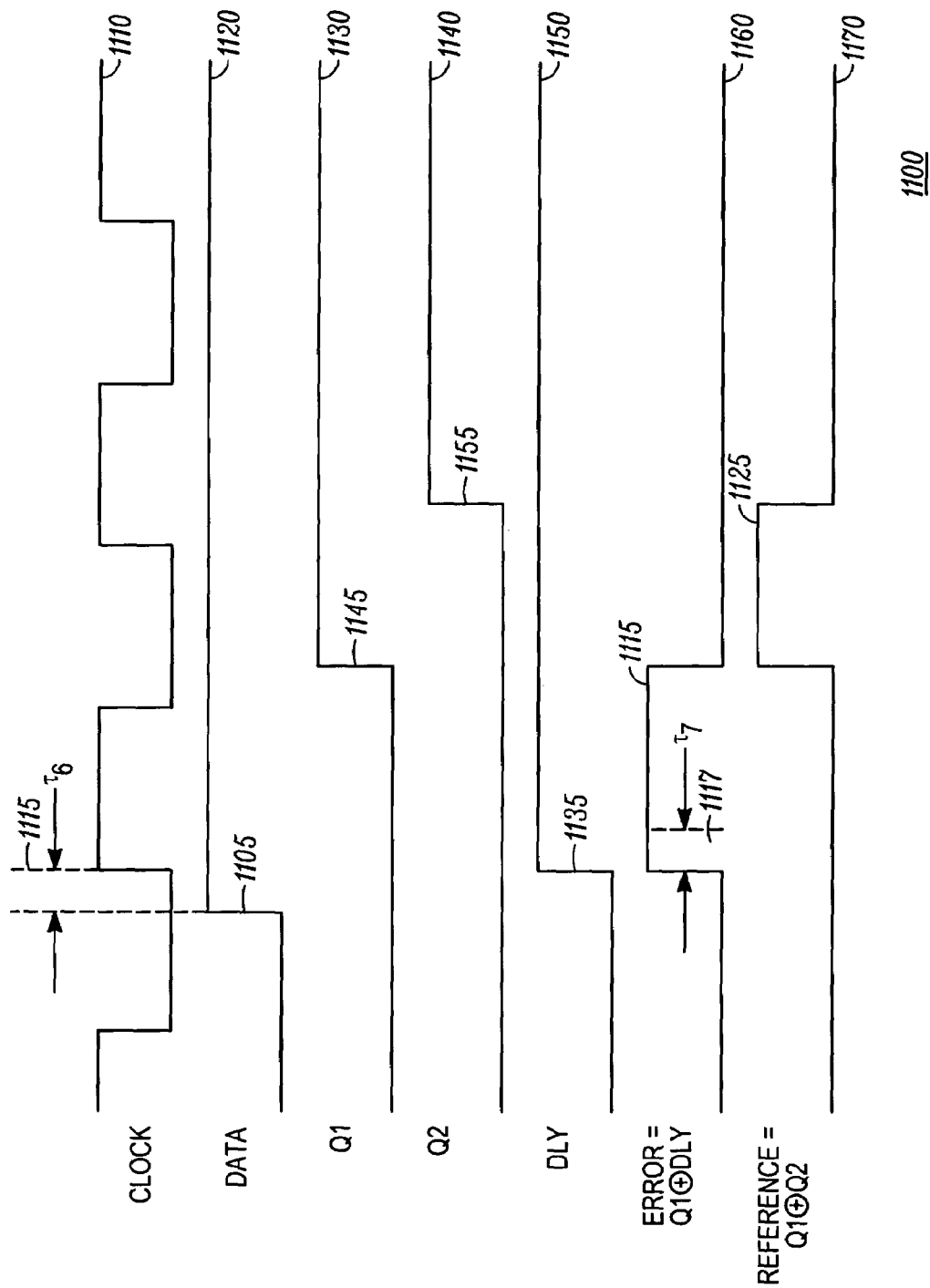
FIG. 11 is a specific timing diagram for a data transition with a leading phase error.

FIG. 11 shows this for a specific DATA transition 1105. Shown is a timing diagram with a phase error $t_6$ 1115 introduced between a data transition 1105 and a CLOCK rising edge 1102. Included are inputs CLOCK 1110 and DATA 1120, and resulting signals Q1 1130, Q2 1140, DLY 1150, ERROR 1160, and REFERENCE 1170. Again, the transition 1105 in DATA 1120 results in a pulse in ERROR waveform 1170, specifically 1115, and a REFERENCE bit 1125. But this time, since the DATA 1120 has been advanced, ERROR pulse 1115 is wider than the corresponding pulse 915 in FIG. 9. Specifically, ERROR pulse 1115 is wider by an amount shown here as $t_7$ 1117. In most cases, $t_7$ is approximately equal to $t_6$. Accordingly, the average value of the ERROR signal 1160 is higher than the average value of the ERROR signal 960 in FIG. 9. But again, since the REFERENCE pulse 1125 is defined by signals timed to the falling and rising edges of the CLOCK 1110, its width does not change as compared to REFERENCE pulse 925 in FIG. 9. Therefore, the difference between the ERROR signal and the REFERENCE signal has changed, and this difference signal can be used to correct for the phase error between DATA transitions such as 1105 and the rising edges of the CLOCK 1110.

Figure 12:
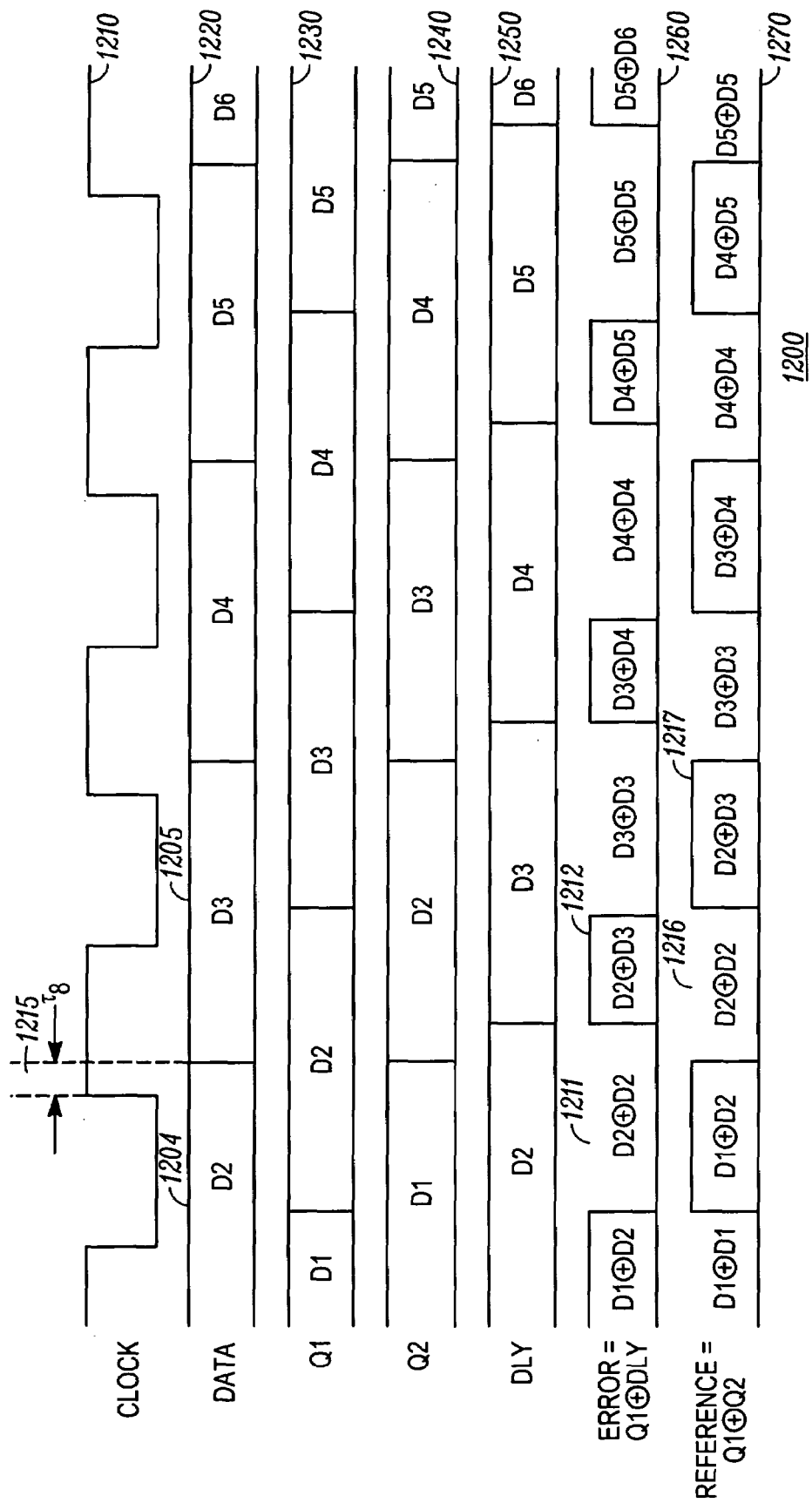
FIG. 12 is a generalized timing diagram with a lagging phase error introduced.

FIG. 12 is a generalized timing diagram of signals in a phase detector consistent with one embodiment of the present convention, such as the block diagram of FIG. 3. But this timing diagram is not limited to the circuit of FIG. 3 and may be generated by other circuitry consistent with the present invention. Included are inputs CLOCK 1210 and DATA 1220, and resulting signals Q1 1230, Q2 1240, DLY 1250, ERROR 1260, and REFERENCE 1270. Data bits, such as 1204 and 1205, have a duration equal to one clock cycle. Each data bit may be high or low, and the DATA signal 1220 may transition or remain constant from one bit to the next.

Q1 1230 is DATA 1220 retimed. There is typically delay between a transition of Q1 1230 as compared to the falling edges of the CLOCK 1210, particularly if Q1 is generated by a flip-flop clocked by falling edges of the CLOCK signal 1210 and having DATA 1220 as its D input. Q2 1240 is Q1 1230 delayed by one half clock cycle. There may be a delay between a transition of Q2 1240 as compared to the rising edge of the CLOCK 1210, particularly if Q2 is generated by a latch that passes data when the CLOCK signal 1210 is high and has Q1 1230 as its D input. Signal DLY 1250 is a delayed version of DATA 1220.

DLY 1250 may be generated by delaying DATA 1220 by an amount approximately equal to the delay of signal Q1 1230 as compared to the CLOCK 1210. ERROR 1260 is generated by XORing Q1 1230 and DLY 1250. REFERENCE 1270 is generated by XORing Q1 1230 and Q2 1240.

In this timing diagram, DATA 1220 is delayed or shifted to the right by a time $t_8$ 1215 relative to the rising edges of CLOCK 1210. A consequence of this is that DLY 1250 is also delayed. Since ERROR pulses begin at transitions in DLY, the ERROR pulses begin late. Specifically, ERROR pulse 1212 starts later than ERROR pulse 812 in FIG. 8. Again, Q1 1230 is DATA 1220 retimed to CLOCK 1210, so Q1 1230 is aligned to Q1 830 in FIG. 8. Since the ERROR pulse 1212 ends when Q1 1230 transitions, pulse 1212 ends at the same relative time as pulse 812. Accordingly, ERROR pulse 1212 starts later and ends at the same relative time as ERROR pulse 812, and is thus narrower.

ERROR signal 1260 is dependent on the phase relationship between DATA 1220 and CLOCK 1210 in the following manner. If data bit 1204—D2—is low and data bit 1205—D3—is high, then ERROR pulse 1212 is high. If the DATA signal 1220 is delayed, that is shifted to the right, then pulse 1212 in the ERROR signal 1270 narrows (becomes shorter in duration).

Figure 13:
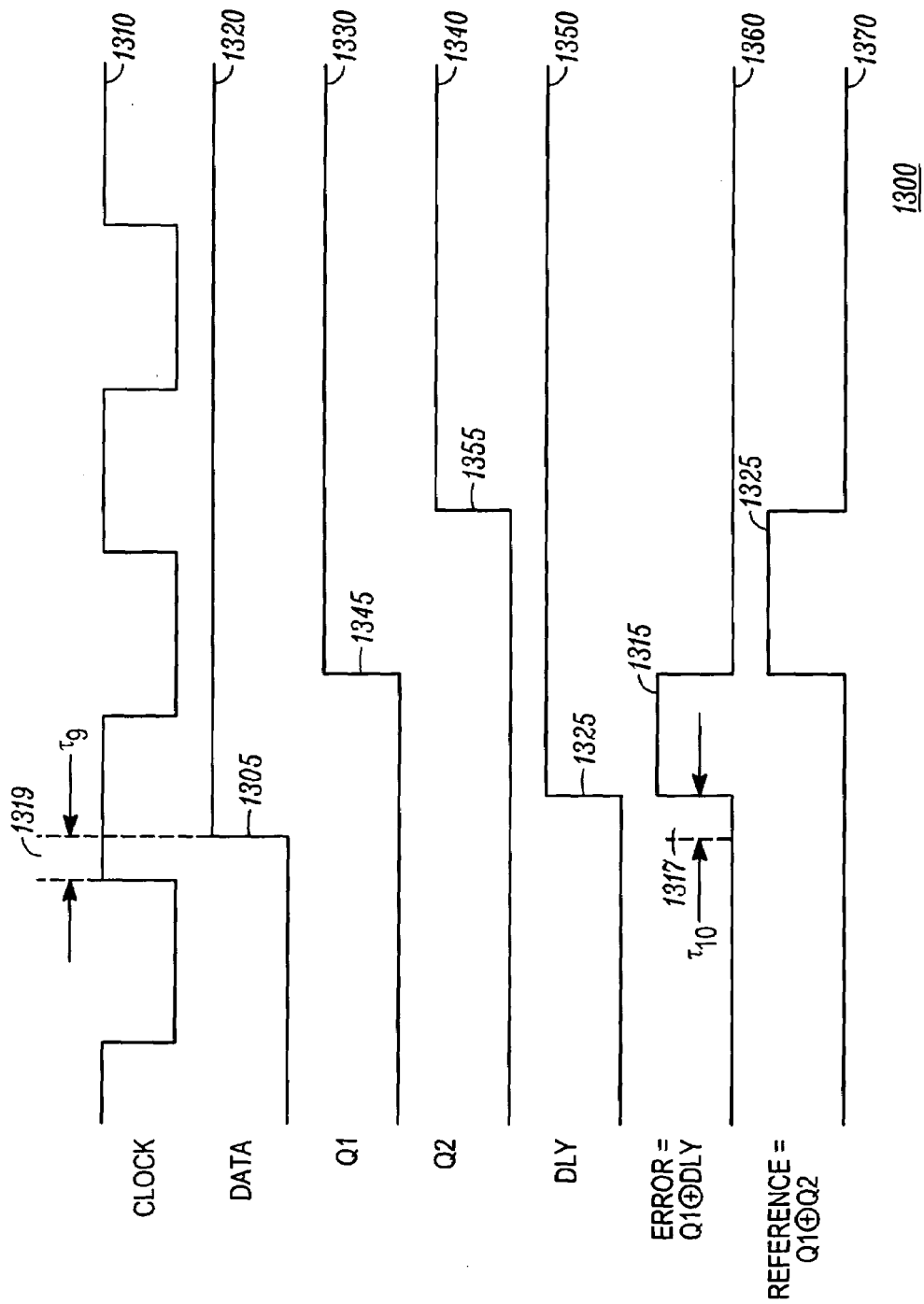
FIG. 13 is a specific timing diagram for a data transition with a lagging phase error.

FIG. 13 shows this for a specific DATA transition 1305. Shown is a timing diagram with a phase error $t_9$ 1315 introduced between a data transition 1305 and a CLOCK rising edge 1302. Included are inputs CLOCK 1310 and DATA 1320, and resulting signals Q1 1330, Q2 1340, DLY 1350, ERROR 1360, and REFERENCE 1370. The transition 1305 in DATA 1320 results in a pulse in ERROR waveform 1370, specifically 1315, and a REFERENCE bit 1325. But this time, since the DATA 1320 has been delayed, ERROR pulse 1315 is narrower than the corresponding pulse 915 in FIG. 9. Specifically, ERROR pulse 1315 is narrower by an amount shown here as to $t_{10}$ 1317. In most cases $t_{10}$ 1317 is approximately equal to $t_9$ 1319. Accordingly, the average value of ERROR signal 1360 is higher than the average value of ERROR signal 960 in FIG. 9. But again, since the REFERENCE pulse 1325 is defined by signals timed to the falling and rising edges of the CLOCK 1310, its width does not change as compared to REFERENCE pulse 925 in FIG. 9. Therefore, the difference between the ERROR signal and the REFERENCE signal has changed, and this difference signal is used to correct for the phase error between DATA transitions such as 1305 and the rising edges of the CLOCK 1310.

Figure 14:
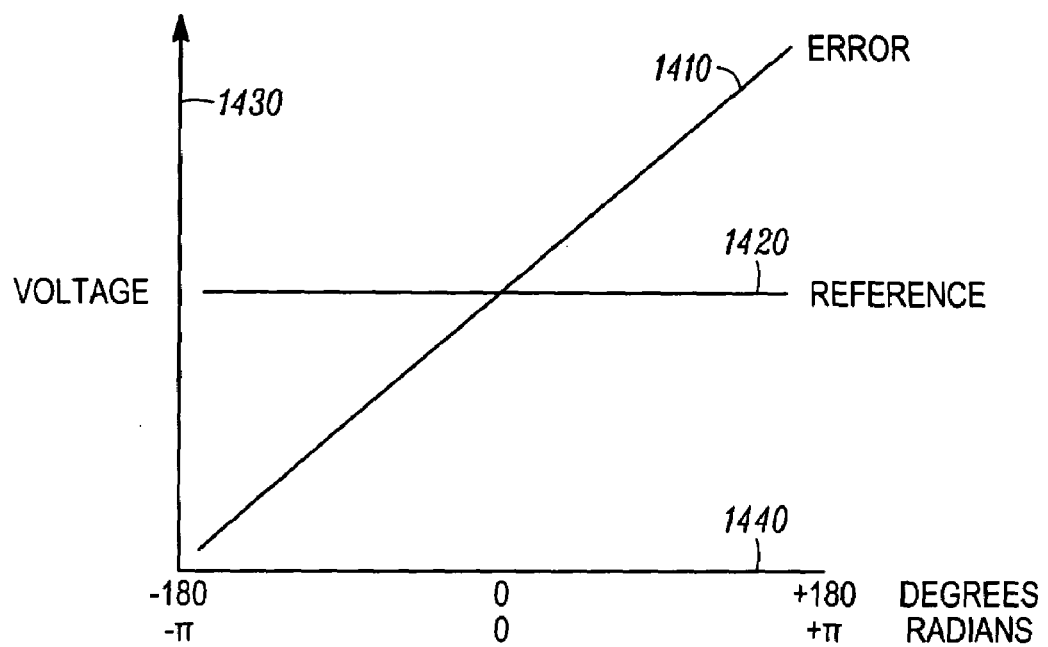
FIG. 14 shows the error and reference voltages as a function of phase error for a high-speed phase detector consistent with an embodiment of the present invention.

FIG. 14 graphs the ERROR voltage and REFERENCE voltage outputs for a full-rate phase detector consistent with one embodiment of the present invention. The ERROR signal 1410 and REFERENCE signal 1420 voltages are graphed as a function of the phase error between the data and CLOCK signals. ERROR signal 1410 is proportional to the phase error. ERROR signal 1410 may be linear. Alternately, ERROR signal may have non-linear characteristics. REFERENCE signal 1420 is approximately independent of the phase error, but is a function of the data pattern. ERROR signal 1410 and REFERENCE signal 1420 may become discontinuous or notched when the phase error is near plus or minus 180 degrees.

Figure 15:
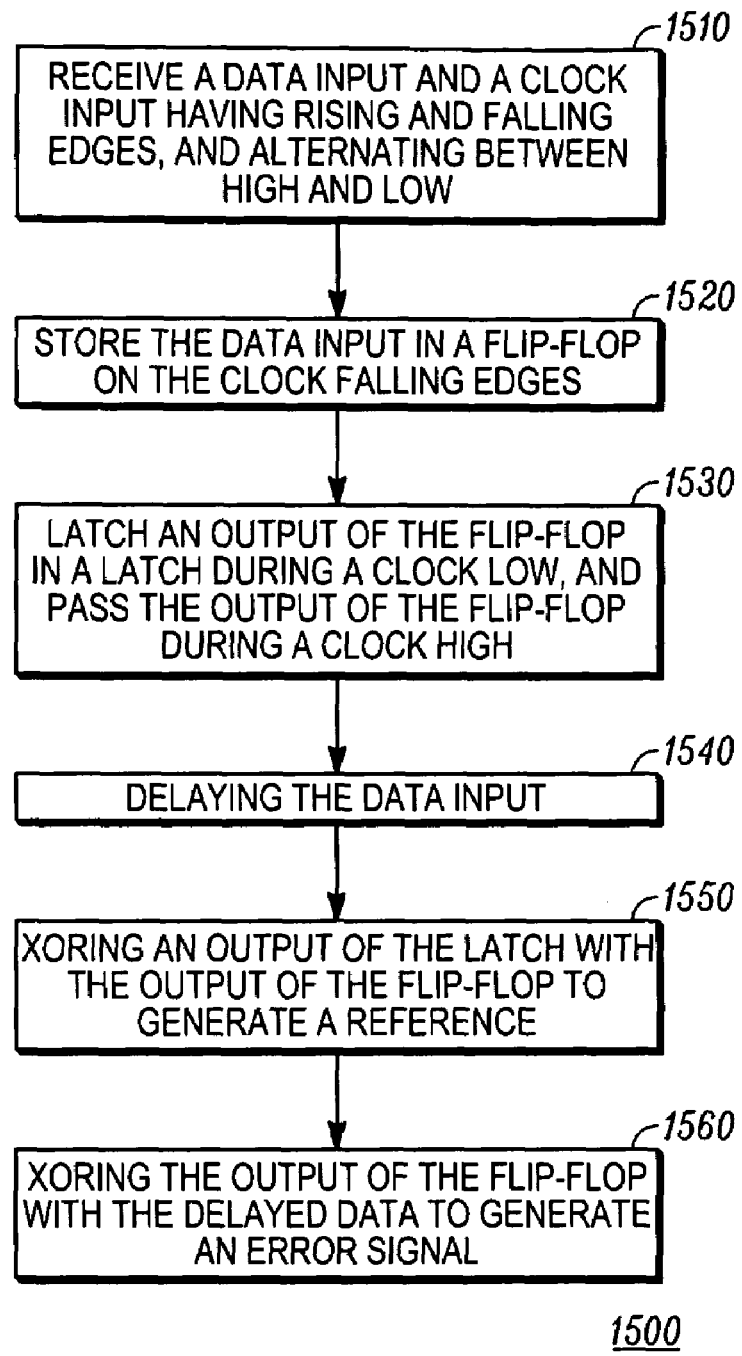
FIG. 15 is a flowchart of a method of recovering data and clock signals consistent with the present invention.

FIG. 15 is a flow chart for a method detecting phase errors between a data signal and clock signal, consistent with one embodiment of the present invention. In act 1510, a data input and a clock input having rising and falling edges and alternating between high and low levels is received. The data input is stored in a first storage unit, such as a flip-flop, on the clock falling edges in act 1520. In act 1530, an output of the first storage unit is received by a second storage unit, such as a latch, and latched during a clock low and passed during a clock high (or a clock low in an alternate embodiment). The data input is delayed in act 1540. The output of the first storage unit and an output of the second storage unit are XORed to generate a reference signal in act 1550. In act 1560, an output of the first storage unit and the delayed data input are XORed to generate an error signal.

It will be apparent to one skilled in the art, that various modifications and additions can be made to this flow chart. For example, the error and reference signals may be applied to a charge pump, or directly to a loop filter in order to generate a VCO control voltage. Also, the first storage unit may store data on the clock rising edges, or the second storage unit may latch during a clock high, and pass data during a clock low.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the following claims.

What is claimed is:

1. A phase detector for recovering data from a received data signal comprising:
    a flip-flop having a data input coupled to a data input port, and a clock input coupled to a clock port;
    a latch having a data input coupled to an output of the first flip-flop, and a clock input coupled to the clock port;
    a delay element having an input coupled to the data input port;
    a first logic circuit having a first input coupled to the output of the flip-flop and a second input coupled to an output of the latch; and
    a second logic circuit having a first input coupled to the output of the first flip-flop and a second input coupled to an output of the delay element,
    wherein the latch comprises:
        first and second MOSFETs having their source terminals connected together, their gate terminals coupled to receive a pair of logic signals, respectively, and their drain terminals connected to a true output and a complementary output, respectively;

a first clocked MOSFET having a drain terminal coupled to the source terminals of the first an second MOSFETs, a gate terminal coupled to receive a first clock signal, and a source terminal;

third and fourth MOSFETs having their source terminals coupled together, their gate terminals and drain terminals respectively cross-coupled to the true output and the complementary output;

a second clocked MOSFET having a drain terminal coupled to the source of the third and fourth MOSFETs, a gate terminal coupled to receive a second clock signal, and a source terminal;

a first load including a resistive element and an inductive element connected in series and coupling the true output to a first power supply terminal;

a second load including a resistive element and an inductive element connected in series and coupling the true output to the first power supply terminal; and a current-source MOSFET coupled between the source terminals of the first and second clocked MOSFETs and a second power supply terminal.

2. The phase detector of claim 1 wherein the first data input port is configured to receive a differential signal.

3. The phase detector of claim 2 wherein the first clock port is configured to receive a differential signal.

4. The phase detector of claim 3 wherein the first logic circuit and the second logic circuit are exclusive-OR gates.

5. The phase detector of claim 3 wherein the first logic circuit and the second logic circuit perform an exclusive-OR function.

6. The phase detector of claim 1 wherein the first logic circuit provides a reference signal, and the second logic circuit provides an error signal.

7. An optical receiver comprising the phase detector of claim 1.

8. An optical transceiver comprising:

an optical transmitter; and the optical receiver of claim 7 coupled to the optical transmitter.

9. The phase detector of claim 1 wherein the flip-flop comprises:

a first clocked latch as set forth in claim 1; and a second clocked latch as set forth in claim 1, wherein, the gate terminals of the first and second MOSFETs in the second clocked latch respectively couple to the true output and the complementary output of the first clocked latch.

* * * * *